(12) United States Patent
Park et al.

(10) Patent No.: US 10,306,198 B2
(45) Date of Patent: May 28, 2019

(54) METHOD AND ELECTRONIC DEVICE FOR DETECTING WAVELENGTH SPECTRUM OF INCIDENT LIGHT

(71) Applicant: Samsung Electronics Co., Ltd., Gyeonggi-do (KR)

(72) Inventors: Kyong Tae Park, Gyeonggi-do (KR); Jeong Won Lee, Gyeonggi-do (KR); Jae Hyoung Park, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/694,287

(22) Filed: Sep. 1, 2017

(65) Prior Publication Data

US 2018/0091790 A1 Mar. 29, 2018

(30) Foreign Application Priority Data

Sep. 23, 2016 (KR) ........................ 10-2016-0122432

(51) Int. Cl.
*H04N 9/73* (2006.01)
*G01J 3/02* (2006.01)
(Continued)

(52) U.S. Cl.
CPC ............ *H04N 9/735* (2013.01); *G01J 3/0208* (2013.01); *G01J 3/0229* (2013.01); *G01J 3/2823* (2013.01);
(Continued)

(58) Field of Classification Search
CPC ........ H04N 9/735; H04N 5/2256; H04N 9/07; H04N 5/3696; H04N 9/045;
(Continued)

(56) References Cited

U.S. PATENT DOCUMENTS 7,423,679 B2 * 9/2008 Szajewski .............. H04N 3/155
348/218.1
8,243,162 B2 8/2012 Wang et al.
(Continued)

FOREIGN PATENT DOCUMENTS

EP 2 833 406 2/2015
EP 2 889 664 7/2015
(Continued)

OTHER PUBLICATIONS

International Search Report dated Dec. 11, 2017 issued in counterpart application No. PCT/KR2017/009028, 12 pages.
(Continued)

*Primary Examiner* — Yogesh K Aggarwal
(74) *Attorney, Agent, or Firm* — The Farrell Law Firm, P.C.

(57) ABSTRACT

A method and electronic device for detecting a wavelength spectrum of incident light. The electronic device includes an image sensor including a pixel array, wherein the pixel array includes a unit pixel including a micro lens configured to focus incident light, and two or more photodetectors configured to output an electrical signal in response to the incident light; and a processor configured to detect a wavelength spectrum of the incident light based on output values from the two or more photodetectors.

19 Claims, 14 Drawing Sheets

(51) Int. Cl.
  *G01J 3/28* (2006.01)
  *H04N 5/225* (2006.01)
  *H04N 9/04* (2006.01)
  *H04N 9/07* (2006.01)
  *H01L 27/146* (2006.01)
  *H04N 5/369* (2011.01)

(52) U.S. Cl.
  CPC .. *H01L 27/14605* (2013.01); *H01L 27/14621* (2013.01); *H01L 27/14627* (2013.01); *H01L 27/14645* (2013.01); *H04N 5/2256* (2013.01); *H04N 5/3696* (2013.01); *H04N 9/045* (2013.01); *H04N 9/07* (2013.01)

(58) Field of Classification Search
  CPC ......... H01L 27/14605; H01L 27/14645; H01L 27/14627; H01L 27/14621; G01J 3/0229; G01J 3/0208; G01J 3/2823
  USPC ................ 348/335, 340, 345, 348, 350, 352
  See application file for complete search history.

(56) References Cited

U.S. PATENT DOCUMENTS

| | | | |
|---|---|---|---|
| 8,587,690 | B2 | 11/2013 | Lee |
| 8,866,954 | B2 | 10/2014 | Koshiba |
| 8,928,775 | B2 | 1/2015 | Lee |
| 8,964,079 | B2 | 2/2015 | Fukuda et al. |
| 9,204,114 | B2 | 12/2015 | Takahashi |
| 9,377,601 | B2 | 6/2016 | Kusaka |
| 9,490,281 | B2 | 11/2016 | Fukuda et al. |
| 9,532,033 | B2 | 12/2016 | Shibazaki et al. |
| 9,621,831 | B2 * | 4/2017 | Inui ...................... H04N 5/3696 |
| 9,723,284 | B2 | 8/2017 | Lee |
| 2002/0140832 | A1 | 10/2002 | Summa |
| 2010/0149403 | A1 | 6/2010 | Wang et al. |
| 2011/0279703 | A1 | 11/2011 | Lee |
| 2012/0025080 | A1 * | 2/2012 | Liu ........................ H04N 5/332 250/332 |
| 2012/0140100 | A1 | 6/2012 | Shlbazaki et al. |
| 2012/0268634 | A1 | 10/2012 | Fukuda et al. |
| 2014/0043501 | A1 | 2/2014 | Lee |
| 2014/0176780 | A1 | 6/2014 | Koshiba |
| 2015/0009373 | A1 | 1/2015 | Takahashi |
| 2015/0070548 | A1 | 3/2015 | Fukuda et al. |
| 2015/0234148 | A1 | 8/2015 | Kusaka |
| 2016/0165202 | A1 | 6/2016 | Lee |
| 2016/0277669 | A1 | 9/2016 | Kusaka |
| 2017/0330348 | A1 | 11/2017 | Park et al. |
| 2017/0332061 | A1 | 11/2017 | Lee |

FOREIGN PATENT DOCUMENTS

| | | |
|---|---|---|
| KR | 1020110037264 | 4/2011 |
| KR | 1020170127638 | 11/2017 |

OTHER PUBLICATIONS

European Search Report dated Feb. 5, 2018 issued in counterpart application No. 17191688.5-1208, 9 pages.

* cited by examiner

METHOD AND ELECTRONIC DEVICE FOR DETECTING WAVELENGTH SPECTRUM OF INCIDENT LIGHT

PRIORITY

This application claims priority under 35 U.S.C. § 119(a) to Korean Patent Application Serial No. 10-2016-0122432, which was filed in the Korean Intellectual Property Office on Sep. 23, 2016, the entire disclosure of which is incorporated herein by reference.

BACKGROUND

1. Field of the Disclosure

The present disclosure relates generally to a method for detecting a wavelength spectrum of incident light and an electronic device performing the same.

2. Description of the Related Art

Compared to a conventional film camera, a digital camera may perform white balancing for correction of a subject based on a color temperature (or Farbtemperatur) of light reflected from the subject upon photographing. White balancing generally includes tracking an achromatic colored area in a photographed image and adjusting a color temperature of the entire photographed image based on a pixel value of the achromatic colored area.

SUMMARY

Accordingly, the present disclosure is made to address at least the above-mentioned problems and/or disadvantages and to provide at least the advantages described below.

An aspect of the present disclosure is to provide a method and an electronic device for accurately detecting a wavelength spectrum of incident light, a color temperature, or a type of a light source by using an image sensor including a plurality of photodetectors in a unit pixel. By more accurately detecting the wavelength spectrum of incident light, the accurately detected wavelength spectrum may be utilized to adjust auto white balance (AWB).

In accordance with an aspect of the present disclosure, an electronic device is provided, which includes an image sensor including a pixel array, wherein the pixel array includes a unit pixel including a micro lens configured to focus incident light, and two or more photodetectors configured to output an electrical signal in response to the incident light; and a processor configured to detect a wavelength spectrum of the incident light based on output values from the two or more photodetectors.

In accordance with another aspect of the present disclosure, a wavelength detecting method is provided for an electronic device that includes a plurality of unit pixels. The method includes obtaining two or more electrical signals from a unit pixel in response to incident light, and detecting a wavelength spectrum of the incident light based on output values of the two or more electrical signals.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
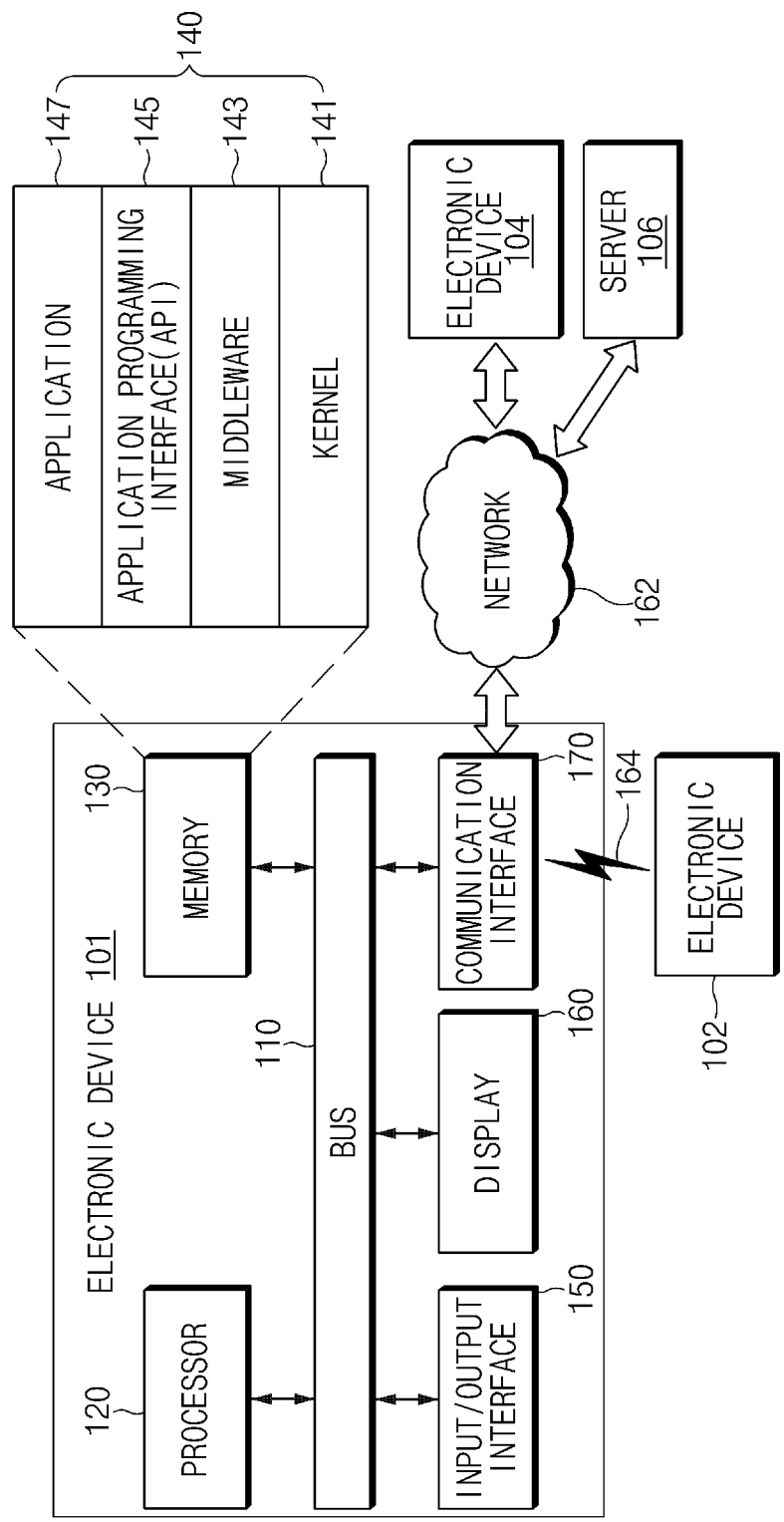
FIG. 1 illustrates an electronic device according to an embodiment of the present disclosure.

Hereinafter, various embodiments of present disclosure will be described with reference to accompanying drawings. Accordingly, those skilled in the art will recognize that modifications, equivalents, and/or alternatives of the various embodiments described herein can be made without departing from the scope and spirit of present disclosure.

With regard to the drawings, similar elements, features, and structures may be marked by similar reference numerals.

Terms and expressions used in this disclosure are used to describe specified embodiments and are not intended to limit the scope of another embodiment. The terms of a singular form may include plural forms unless otherwise specified. All the terms used herein, which include technical or scientific terms, may have the same meanings that are generally understood by those skilled in the art. Further, terms that are defined in a dictionary and commonly used should also be interpreted as is customary in the relevant art and not in idealized or overly formal ways unless expressly so defined as such herein. In some cases, even if certain terms are defined in this disclosure, they may not be interpreted to exclude embodiments of this disclosure.

Herein, the expressions "have", "may have", "include" "comprise", "may include", and "may comprise" indicate the existence of corresponding features (e.g., numeric values, functions, operations, or components) but do not exclude presence of additional features.

The expressions "A or B", "at least one of A or/and B", "one or more of A or/and B", etc., may include any and all combinations of the one or more listed items. For example, "A or B", "at least one of A and B", or "at least one of A or B" may refer to (1) where at least one A is included, (2) where at least one B is included, or (3) where both of at least one A and at least one B are included.

Terms, such as "first", "second", etc., may refer to various elements regardless of an order and/or a priority of the elements, and may distinguish the elements from other elements, but do not limit the elements. For example, "a first user device" and "a second user device" indicate different user devices regardless of the order or the priority. Accordingly, a first element may be referred to as a second element, and similarly, a second element may be referred to as a first element.

When an element (e.g., a first element) is referred to as being "(operatively or communicatively) coupled with/to" or "connected to" another element (e.g., a second element), the first element may be directly coupled with/to or connected to the second element or an intervening element (e.g., a third element) may be present therebetween. However, when the first element is referred to as being "directly coupled with/to" or "directly connected to" the second element, there are no intervening elements therebetween.

According to context, the expression "configured to" may be used interchangeably with, for example, "suitable for", "having the capacity to", "designed to", "adapted to", "made to", or "capable of". The expression "configured to" does not mean only "specifically designed to" in hardware. Instead, "a device configured to" may indicate that the device is "capable of" operating together with another device or other components. For example, a "processor configured to (or set to) perform A, B, and C" may indicate a dedicated processor (e.g., an embedded processor) for performing a corresponding operation or a generic-purpose processor (e.g., a central processing unit (CPU) or an application processor (AP)) which performs corresponding operations by executing one or more software programs that are stored in a memory device.

An electronic device according to an embodiment of the present disclosure may include a smartphones, a tablet personal computer (PC), a mobile phone, a video telephone, an electronic book reader, a desktop PC, a laptop PC, a netbook computer, a workstation, a servers, a personal digital assistant (PDA), a portable multimedia player (PMPs), a Motion Picture Experts Group (MPEG-1 or MPEG-2) Audio Layer 3 (MP3) player, a mobile medical device, a camera, or a wearable device. For example, the wearable device may include an accessory type device (e.g., a watch, a ring, a bracelet, a anklet, a necklace, glasses, a contact lens, or a head-mounted-device (HMDs), a fabric or garment-integrated type device (e.g., an electronic apparel), a body-attached type device (e.g., a skin pad or a tattoo), or a bio-implantable type device (e.g., an implantable circuit).

The electronic device may also be a home appliance, such as a television (TV), a digital versatile disc (DVD) player, an audio player, a refrigerator, an air conditioner, a cleaner, an oven, a microwave oven, a washing machine, an air cleaner, a set-top box, a home automation control panel, a security control panel, a TV box (e.g., Samsung HomeSync™, Apple TV™, and Google TV™), a game console (e.g., an Xbox™ and a PlayStation™), an electronic dictionary, an electronic key, a camcorder, an electronic picture frame, etc.

The electronic device may also include a medical device (e.g., a portable medical measurement device, such as a blood glucose monitoring device, a heartbeat measuring device, a blood pressure measuring device, a body temperature measuring device, etc., a magnetic resonance angiography (MRA) device, a magnetic resonance imaging (MRI) device, a computed tomography (CT) device, a scanner device, and an ultrasonic device), a navigation device, a Global Navigation Satellite System (GNSS) device, an event data recorder (EDR), a flight data recorder (FDR), a vehicle infotainment device, an electronic equipment for vessels (e.g., a navigation system and a gyrocompass), an avionics device, a security device, a head unit for a vehicle, an industrial or home robot, an automatic teller machine (ATM), a point of sales (POS) device, or an Internet of things (IoT) device (e.g., a light bulb, a sensor, an electric or gas meter, a sprinkler device, a fire alarm, a thermostat, a street lamp, a toaster, exercise equipment, a hot water tank, a heater, a boiler, etc.).

The electronic device may also include a part of furniture and/or buildings/structures, an electronic board, an electronic signature receiving device, a projector, or a measuring instrument (e.g., a water meter, an electricity meter, a gas meter, a wave meter, etc.).

The electronic device may also be a flexible electronic device.

The electronic device may also be a combination of at least two of the above-described devices.

However, an electronic device is not be limited to the above-described devices and may include other devices and new devices according to the development of new technologies.

Herein, the term "user" may refer to a person who uses an electronic device or may refer to a device (e.g., an artificial intelligence device) that uses the electronic device.

FIG. 1 illustrates an electronic device, according to an embodiment of the present disclosure.

Referring to FIG. 1, electronic devices 101, 102, and 104 and a server 106 are connected with each other over a network 162 and a local wireless communication 164. The electronic device 101 includes a bus 110, a processor 120, a memory 130, an input/output interface 150, a display 160, and a communication interface 170. Alternatively, the electronic device 101 may omit at least one of the above-described elements and/or may include other element(s).

The bus 110 interconnects the above-described elements 110 to 170 and may include a circuit for conveying communications (e.g., a control message and/or data) among the above-described elements.

The processor 120 may include one or more of a CPU, an AP, and a communication processor (CP). The processor 120 may perform an arithmetic operation or data processing associated with control and/or communication of at least one other element(s) of the electronic device 101.

The memory 130 may include a volatile and/or nonvolatile memory. The memory 130 may store instructions or data associated with at least one other element(s) of the electronic device 101. The memory 130 stores software and/or a program 140. The program 140 includes a kernel 141, a middleware 143, an application programming interface (API) 145, and an application program (or "an application") 147. At least a part of the kernel 141, the middleware 143, and/or the API 145 may be referred to as an "operating system (OS)".

The kernel 141 may control or manage system resources (e.g., the bus 110, the processor 120, the memory 130, etc.) that are used to execute operations or functions of other programs (e.g., the middleware 143, the API 145, and the application program 147). Further, the kernel 141 may provide an interface that allows the middleware 143, the API 145, and/or the application program 147 to access discrete elements of the electronic device 101 in order to control or manage system resources.

The middleware 143 may perform a mediation role for the API 145 or the application program 147 communicates with the kernel 141 to exchange data.

The middleware 143 may process one or more task requests received from the application program 147 according to a priority. For example, the middleware 143 may assign the priority, which makes it possible to use a system resource (e.g., the bus 110, the processor 120, the memory 130, etc.) of the electronic device 101, to at least one of the application program 147. The middleware 143 may process the one or more task requests according to the assigned priority, in order to perform scheduling or load balancing on the one or more task requests.

The API 145 may be an interface through which the application program 147 controls a function provided by the kernel 141 or the middleware 143, and may include at least one interface or function (e.g., an instruction) for a file control, a window control, image processing, a character control, etc.

The input/output interface 150 may act as an interface that transmits an instruction or data input from a user or another external device, to other element(s) of the electronic device 101. Further, the input/output interface 150 may output an instruction or data, received from other element(s) of the electronic device 101, to a user or another external device.

The display 160 may include a liquid crystal display (LCD), a light-emitting diode (LED) display, an organic LED (OLED) display, a microelectromechanical systems (MEMS) display, and/or an electronic paper display. The display 160 may display various content (e.g., a text, an image, a video, an icon, a symbol, etc.) to a user. The display 160 may include a touch screen and may receive a touch, gesture, proximity, and/or hovering input using an electronic pen or a part of a user's body.

The communication interface 170 may establish communication between the electronic device 101 and the first external electronic device 102, the second external electronic device 104, and/or the server 106. The communication interface 170 may be connected to the network 162 over wireless communication or wired communication to communicate with the second external electronic device 104 and/or the server 106.

The wireless communication may include cellular communication, e.g., long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), etc. The wireless communication may include at least one of wireless fidelity (Wi-Fi), Bluetooth, Bluetooth low energy (BLE), Zigbee, near field communication (NFC), magnetic stripe transmission (MST), radio frequency (RF), a body area network (BAN), and a global navigation satellite system (GNSS).

The MST may generate a pulse in response to transmission data using an electromagnetic signal, and the pulse may generate a magnetic field signal. The electronic device 101 may transfer the magnetic field signal to a POS, which detects the magnetic field signal using an MST reader. The POS may recover the data by converting the detected magnetic field signal to an electrical signal.

The GNSS may include at least one of, for example, a global positioning system (GPS), a global navigation satellite system (Glonass), a Beidou navigation satellite system (Beidou), or a European global satellite-based navigation system (Galileo) based on an available region, a bandwidth, etc. Hereinafter, "GPS" and "GNSS" may be interchangeably used.

The wired communication may include at least one of a universal serial bus (USB), a high definition multimedia interface (HDMI), a recommended standard-232 (RS-232), a plain old telephone service (POTS), etc.

The network 162 may include at least one of telecommunications networks, such as a computer network (e.g., a local area network (LAN) or a wide area network (WAN)), an Internet, or a telephone network.

Each of the first and second external electronic devices 102 and 104 may be the same or different types of devices as the electronic device 101.

The server 106 may include a group of one or more servers.

All or a portion of operations performed in the electronic device 101 may be executed by the electronic devices 102 and 104 and/or the server 106. For example, when the electronic device 101 executes a function or service (automatically or in response to a request), the electronic device 101 may request at least a portion of a function associated with the electronic device 101 be performed by the electronic device 102, the electronic device 104, and/or the server 106. The electronic devices 102 and 104 and/or the server 106 may execute the requested function or additional function and may transmit the execution result to the electronic device 101. The electronic device 101 may provide the requested function or service using the received result or may additionally process the received result to provide the requested function or service. For example, cloud computing, distributed computing, or client-server computing may be used.

Figure 2:
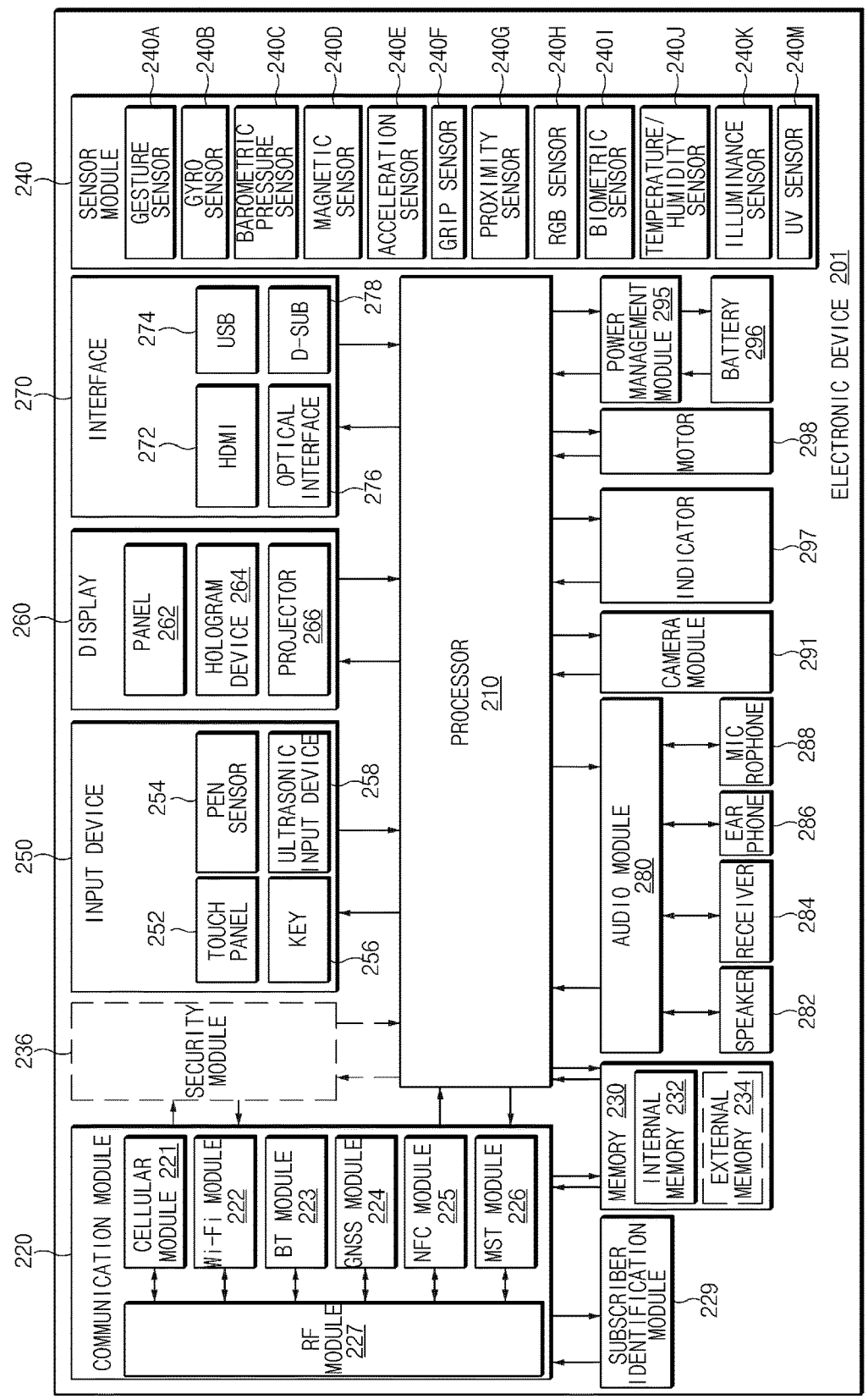
FIG. 2 illustrates an electronic device according to an embodiment of the present disclosure.

FIG. 2 illustrates an electronic device, according to an embodiment of the present disclosure.

Referring to FIG. 2, an electronic device 201 includes a processor 210, a communication module 220, a subscriber identification module (SIM) 229, a memory 230, a sensor module 240, an input device 250, a display 260, an interface 270, an audio module 280, a camera module 291, a power management module 295, a battery 296, an indicator 297, and a motor 298.

The processor 210 may operate an OS or an application to control a plurality of hardware or software elements connected to the processor 210 and may process and compute a variety of data. For example, the processor 210 may be implemented with a system on chip (SoC). The processor 210 may include a graphic processing unit (GPU) and/or an image signal processor. The processor 210 may include at least a part of the other elements illustrated in FIG. 2 (e.g., a cellular module 221). The processor 210 may load an instruction or data, which is received from at least one of other elements (e.g., a nonvolatile memory), into a volatile memory and process the loaded instruction or data. The processor 210 may store a variety of data in the nonvolatile memory.

The communication module 220 includes the cellular module 221, a Wi-Fi module 222, a Bluetooth (BT) module 223, a GNSS module 224 (e.g., a GPS module, a Glonass module, a Beidou module, or a Galileo module), an NFC module 225, an MST module 226, and a radio frequency (RF) module 227.

The cellular module 221 may provide voice communication, video communication, a character service, an Internet service, etc., over a communication network. The cellular module 221 may perform identification and authentication of the electronic device 201 within a communication network by using the SIM 229 (e.g., a SIM card). The cellular module 221 may perform at least a portion of functions that the processor 210 provides. The cellular module 221 may include a CP.

Each of the Wi-Fi module 222, the BT module 223, the GNSS module 224, the NFC module 225, and the MST module 226 may include a processor for processing data exchanged through a corresponding module. At least two of the cellular module 221, the Wi-Fi module 222, the BT module 223, the GNSS module 224, the NFC module 225, and the MST module 226 may be included within an Integrated Circuit (IC) or an IC package.

The RF module 227 may transmit and receive a communication signal (e.g., an RF signal). The RF module 227 may include a transceiver, a power amplifier module (PAM), a frequency filter, a low noise amplifier (LNA), an antenna, etc. At least one of the cellular module 221, the Wi-Fi module 222, the BT module 223, the GNSS module 224, the NFC module 225, and the MST module 226 may transmit and receive an RF signal through a separate RF module.

The SIM 229 may include a card and/or embedded SIM that includes unique identify information (e.g., an integrated circuit card identifier (ICCID)) or subscriber information (e.g., international mobile subscriber identity (IMSI)).

The memory 230 includes an internal memory 232 and an external memory 234. The internal memory 232 may include at least one of a volatile memory (e.g., a dynamic random access memory (DRAM), a static RAM (SRAM), a synchronous DRAM (SDRAM), etc.), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory, a NOR flash memory), etc.), a hard drive, or a solid state drive (SSD).

The external memory 234 may include a flash drive, such as a compact flash (CF), a secure digital (SD), a micro secure digital (Micro-SD), a mini secure digital (Mini-SD), an extreme digital (xD), a multimedia card (MMC), a memory stick, etc. The external memory 234 may be operatively and/or physically connected to the electronic device 201 through various interfaces.

A security module 236 may include a storage space having a higher security level than that of the memory 230 and may be a circuit that guarantees safe data storage and a protected execution environment. The security module 236 may be implemented with a separate circuit and may include a separate processor. For example, the security module 236 may be in a smart chip or an SD card, which is removable, or may include an embedded secure element (eSE) embedded in a fixed chip of the electronic device 201. The security module 236 may operate based on an OS that is different from the OS of the electronic device 201. For example, the security module 236 may operate based on java card open platform (JCOP) OS.

The sensor module 240 may measure a physical quantity or may detect an operation state of the electronic device 201. The sensor module 240 may convert the measured or detected information to an electric signal. The sensor module 240 includes a gesture sensor 240A, a gyro sensor 240B, a barometric pressure sensor 240C, a magnetic sensor 240D, an acceleration sensor 240E, a grip sensor 240F, a proximity sensor 240G, a color sensor 240H (e.g., an red, green, blue (RGB) sensor), a biometric sensor 240I, a temperature/humidity sensor 240J, an illuminance sensor 240K, and an UV sensor 240M. Additionally or alternatively, the sensor module 240 may include an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling at least one of the sensors included therein.

The electronic device 201 may further include a processor, which is a part of the processor 210 or independent of the processor 210, configured to control the sensor module 240. The processor may control the sensor module 240 while the processor 210 remains in a sleep state.

The input device 250 includes a touch panel 252, a (digital) pen sensor 254, a key 256, and an ultrasonic input unit 258. The touch panel 252 may use at least one of capacitive, resistive, infrared and ultrasonic detecting methods. The touch panel 252 may further include a control circuit and/or a tactile layer to provide a tactile reaction to a user.

The (digital) pen sensor 254 may be a part of a touch panel or may include an additional sheet for recognition.

The key 256 may include a physical button, an optical key, and/or a keypad.

The ultrasonic input device 258 may detect (or sense) an ultrasonic signal, which is generated from an input device, through a microphone 288 and may check data corresponding to the detected ultrasonic signal.

The display 260 includes a panel 262, a hologram device 264, and a projector 266. The panel 262 may be flexible, transparent, and/or wearable. The panel 262 and the touch panel 252 may be integrated into a single module.

The hologram device 264 may display a stereoscopic image in a space using a light interference phenomenon.

The projector 266 may project light onto a screen in order to display an image. For example, the screen may be arranged in the inside or the outside of the electronic device 201.

The panel 262 may include a pressure sensor (or force sensor) that measures the intensity of touch pressure by a user. The pressure sensor may be implemented integrally with the touch panel 252, or may be implemented as at least one sensor separately from the touch panel 252.

The display 260 may further include a control circuit for controlling the panel 262, the hologram device 264, and/or the projector 266.

The interface 270 includes an HDMI 272, a USB 274, an optical interface 276, and a D-subminiature (D-sub) 278. Additionally or generally, the interface 270 may include a mobile high definition link (MHL) interface, an SD card/multi-media card (MMC) interface, and/or an infrared data association (IrDA) standard interface.

The audio module 280 may convert a sound and an electric signal in dual directions. The audio module 280 may process sound information that is input or output through a speaker 282, a receiver 284, an earphone 286, and/or the microphone 288.

The camera module 291 may shoot a still image or a video. The camera module 291 may include one or more image sensors (e.g., a front sensor and/or a rear sensor), a lens, an image signal processor (ISP), and/or a flash (e.g., an LED or a xenon lamp).

The power management module 295 may manage power of the electronic device 201. A power management integrated circuit (PMIC), a charger IC, and/or a battery gauge may be included in the power management module 295. The PMIC may have a wired charging method and/or a wireless charging method. The wireless charging method may include a magnetic resonance method, a magnetic induction method, or an electromagnetic method. The wireless charging method may further include an additional circuit, e.g., a coil loop, a resonant circuit, a rectifier, etc.

The battery gauge may measure a remaining capacity of the battery 296 and a voltage, current, and/or temperature of the battery 296 while being charged. The battery 296 may include a rechargeable battery and/or a solar battery.

The indicator 297 may display a specified state of the electronic device 201 or a part thereof (e.g., the processor 210), such as a booting state, a message state, a charging state, etc.

The motor 298 may convert an electrical signal into a mechanical vibration and may generate the following effects: vibration, haptic, etc.

Although not illustrated, a processing device (e.g., a GPU) for supporting a mobile TV may be included in the electronic device 201. The processing device for supporting the mobile TV may process media data according to the standards of digital multimedia broadcasting (DMB), digital video broadcasting (DVB), MediaFLO™, etc.

Each of the above-mentioned elements of the electronic device 201 may be configured with one or more components, and the names of the elements may be changed according to the type of the electronic device 201.

Alternatively, the electronic device 201 may omit at least one of the above-mentioned elements, and/or additional elements may be added. Further, some of the elements of the electronic device 201 may be combined with each other so as to form one entity, so that the functions of the elements may be performed in the same manner as before the combination.

Figure 3:
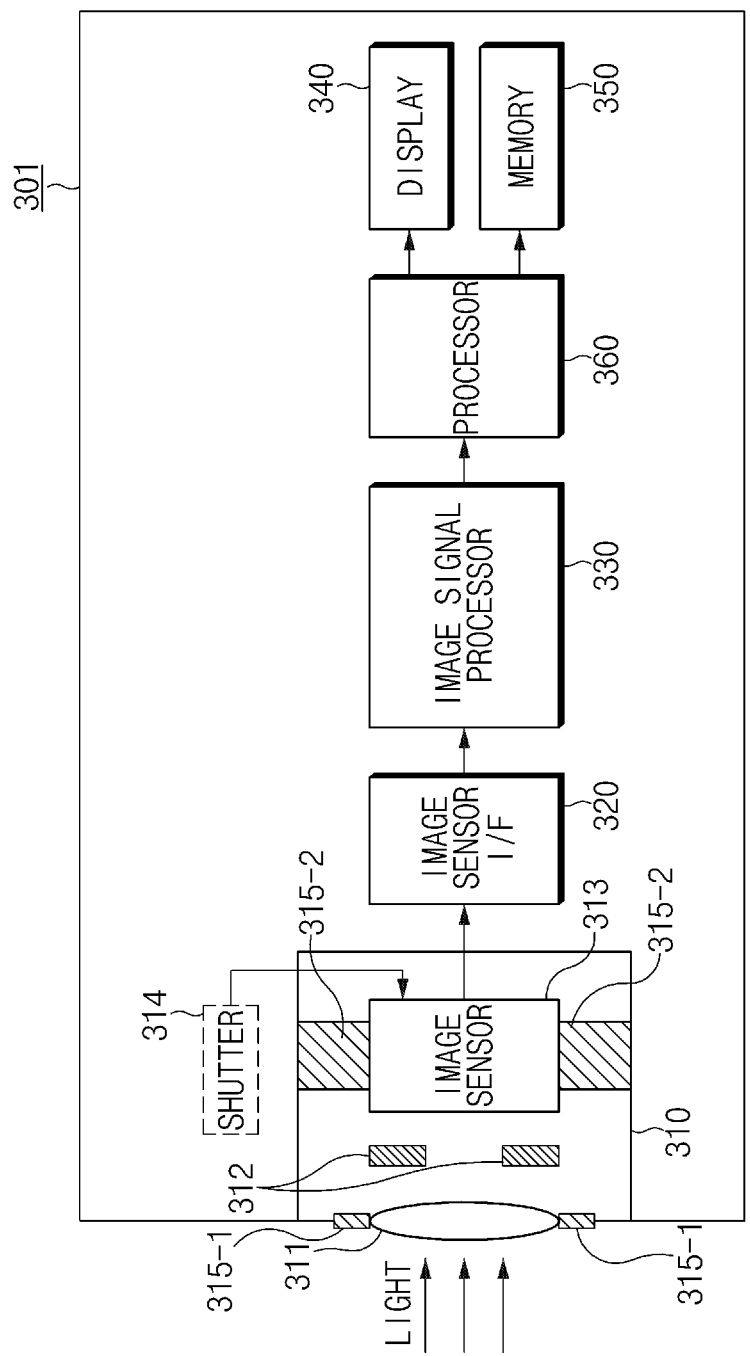
FIG. 3 illustrates an electronic device according to an embodiment of the present disclosure.

FIG. 3 illustrates an electronic device according to an embodiment of the present disclosure.

Referring to FIG. 3, an electronic device 301 includes a camera module 310, an image sensor interface (I/F) 320, an image signal processor (ISP) 330, a display 340, a memory 350, and a processor 360. Alternatively, the electronic device 301 may be implemented without some of the illustrated elements and/or may be implemented to include one or more elements not illustrated in FIG. 3.

The camera module 310 includes a lens 311, an aperture 312, an image sensor 313, a shutter 314, and an optical image stabilization (OIS) module 315-1 and 315-2. Alternatively, the camera module 310 may be implemented without some of the illustrated elements and/or may be implemented to include one or more elements not illustrated in FIG. 3.

The lens 311 may focus light incident on the camera module 310 from the outside. The focused light may reach the image sensor 313 through the aperture 312. That is, the lens 311 may allow light reflected by a subject or light produced from the subject to reach a pixel array of the image sensor 313.

The aperture 312 may adjust the amount of light (i.e., the intensity of radiation) reaching (or incident on) the image sensor 313 under control of the processor 360. Generally, the amount of light reaching the image sensor 313 decreases as an aperture value becomes greater and increases as the aperture value becomes smaller.

The image sensor 313 may include the pixel array in which a plurality of pixels are two-dimensionally arranged in a lattice shape. The pixel array may include millions or tens of millions of pixels, and one of a plurality of predetermined (or primary) colors may be allocated to each of the pixels. For example, the plurality of predetermined colors may include red, green, and blue (RGB) or red, green, blue, and white (RGBW). The image sensor 313 may be implemented using charge-coupled device (CCD) or complementary metal-oxide-semiconductor (CMOS).

The image sensor 313 may generate an electrical signal in response to light incident from the outside. Digital image data may be generated based on the electrical signal.

The shutter 314 may adjust a time when the image sensor 313 is exposed to light. For example, if the shutter 314 operates (i.e., opens and closes) slowly, a relatively large amount of light may be incident on the image sensor 313. However, if the shutter 314 operates quickly, a relatively small amount of light may be incident on the image sensor 313. A time when the shutter 314 operates may be adjusted based on a shutter speed. The shutter 314 may include a mechanical shutter or an electronic shutter.

The OIS module 315-1 and 315-2 may dynamically adjust an arrangement (or position) of the lens 311 or the image sensor 313. The OIS module 315-1 and 315-2 may finely adjust the arrangement of the lens 311 or the image sensor 313 in a direction that is opposite to a direction of movement of a hand gripping the electronic device 301. Accordingly, it may be possible to correct the blurring of an image due to the movement of the hand. The OIS module 315-1 and 315-2 may be referred to as a vibration reduction (VR) module, an image stabilizer (IS), an optical stabilizer, an anti-shake (AS) module, a steady shot module, etc., according to a manufacturer of the electronic device 301.

The image sensor I/F 320 may mediate data exchange between the image sensor 313 and the ISP 330. For example, the image sensor I/F 320 may transfer image data generated in the image sensor 313 to the ISP 330.

The ISP 330 may include a plurality of image processing blocks (IP blocks). The ISP 330 may correct an image from the camera module 310 through the plurality of IP blocks. For example, the IP blocks may include various IP blocks such as an IP block for color interpolation, an IP block for lens shading correction, an IP block for (AWB), an IP block for lateral chromatic aberration correction, an IP block for optical inverse correction, an IP block for noise reduction, an IP block for edge enhancement, an IP block for gamma correction, and/or an IP block for out of focusing. The plurality of IP blocks may be also referred to as an "image processing filter", an "image processing module", etc. The ISP 330 may be included in the processor 360.

The display 340 may include an LCD, an LED display, an OLED display, a MEMS display, an electronic paper display, etc. The display 340 may display an image corrected by the ISP 330, after being taken through the camera module 310.

The memory 350 may include a volatile and/or nonvolatile memory. The memory 350 may store instructions or data associated with at least one other element(s) of the electronic device 301. The memory 350 may store an image data file as a final result processed in the image signal processor 330.

The memory 350 may store data associated with a correlation between a specific parameter and a wavelength spectrum. The parameter may be obtained through a computation using values (e.g., pixel values) of electrical signals output from two or more photodetectors included in a unit element of the image sensor 313. The data associated with the correlation may be stored in a look-up table (LUT).

The memory 350 may further store LUT data in which a wavelength spectrum and a type (or color temperature) of a light source are correlated.

The processor 360 may be electrically connected with the elements 310 to 350 included in the electronic device 301 to execute operations or data processing associated with control and/or communication of the elements 310 to 350 included in the electronic device 301.

The processor 360 may obtain output values from two or more photodetectors included in the unit pixel of the image sensor 313 and may detect a wavelength spectrum of incident light based on the output values.

The processor 360 may compute at least one parameter by using output values from two or more photodetectors included in the unit pixel. The processor 360 may detect a wavelength spectrum of incident light, based on the at least one parameter. The processor 360 may detect the wavelength spectrum of the incident light with reference to data associated with a correlation between the at least one parameter and the wavelength spectrum, stored in the memory 350.

The processor 360 may determine a type of a light source producing the incident light based on the detected wavelength spectrum. For example, the processor 360 may determine a type of a light source with reference to a correlation between the wavelength spectrum and the type of the light source, stored in the memory 350. The processor 360 may apply white balance correction corresponding to the determined type of the light source to at least part of a photographed image.

The processor 360 may detect a phase difference based on a ratio of output values from two or more photodetectors included in the unit pixel. The phase difference may be used for an auto focus function.

The above-described operations of the processor 360 are, but are not limited to, an example. For example, operations of a processor described in other parts of this specification should be understood as operations of the processor 360. Also, in this specification, at least some of operations described as operations of an "electronic device" should be understood as operations of the processor 360.

Figure 4:
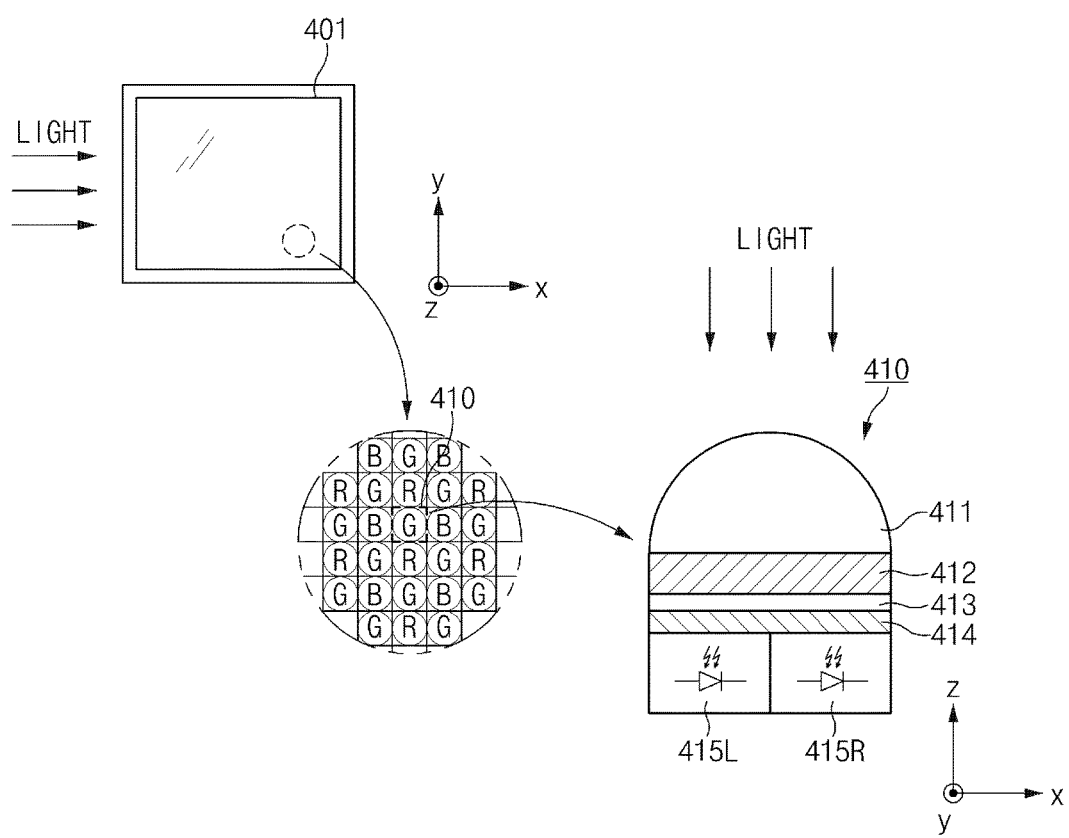
FIG. 4 illustrates an image sensor according to an embodiment of the present disclosure.

FIG. 4 illustrates an image sensor according to an embodiment of the present disclosure.

Referring to FIG. 4, an image sensor 401 includes a plurality of pixels (e.g., millions to tens of millions). Hundreds or thousands of pixels among the plurality of pixels may be arranged in an x axis direction (horizontal direction), and likewise, hundreds or thousands of pixels among the plurality of pixels may be arranged in a y-axis direction (vertical direction). For example, the image sensor 401 may be used as the image sensor 313 illustrated in FIG. 3.

A specified predetermined color (red (R), green (G), or blue (B)) is allocated to each of the plurality of pixels included in the image sensor 401. The plurality of pixels may be designed to receive light, which has a wavelength range specified to each pixel, of light incident in a z-axis direction. An electrical signal may be output from each of the plurality of pixels in response to the received light.

A unit pixel 410 includes a micro lens 411, various films or filters 412 to 414, a first photodetector 415L, and a second photodetector 415R. Alternatively, the unit pixel 410 may further include any other elements, such as a conductive pattern, a high refractive pattern, etc., and the conductive pattern may be used to electrically connect the photodetectors 415L and 415R and an image processor. While the unit pixel 410 includes only two photodetectors 415L and 415R, the present disclosure is not be limited thereto, and the unit pixel 410 may include three or more photodetectors (e.g., see FIG. 8). The micro lens 411 may focus incident light to allow the incident light to reach the first photodetector 415L and the second photodetector 415R. The incident light may be refracted by the micro lens 411 to form an optical spot on the first photodetector 415L and the second photodetector 415R.

An infra-red cut filter 412 may block at least part of infra-red rays of light incident through the micro lens 411. For example, the infra-red cut filter 412 may prevent overexposure in the daytime, when a light source is sufficient. The infra-red cut filter 412 may be excluded at night.

A color filter 413 may be disposed below the micro lens 411 to pass light having a specified predetermined color, that is, light having a specified wavelength range. For example, the color filter 413 may correspond to one of a red filter, a green filter, and a blue filter. A Bayer pattern of the image sensor 401 may be implemented by the color filter 413.

An anti-reflection film 414 may increase the amount of incident light reaching the first photodetector 415L and the second photodetector 415R by preventing light incident through the micro lens 411 from being reflected.

Each of the first photodetector 415L and the second photodetector 415R may correspond to a photo diode formed on a semiconductor substrate. Each of the first photodetector 415L and the second photodetector 415R may output an electrical signal in response to incident light, by the photoelectric effect. Each of the first photodetector 415L and the second photodetector 415R may produce charges (or a current) according to the intensity (or the intensity of radiation) of received light. An output value may be determined based on the amount of charges (or the current). The photodetectors 415L and 415R may be collectively referred to as an "imaging device".

Although the two photodetectors 415L and 415R are disposed in one unit pixel in FIG. 4, the present disclosure is not limited thereto, and one photodetector or two or more photodetectors may be disposed in one unit pixel. A pixel in which three or more photodetectors are disposed may be referred to as a "multi-pixel", and a pixel in which two photodetectors are disposed may be referred to as a "dual pixel".

Figure 5:
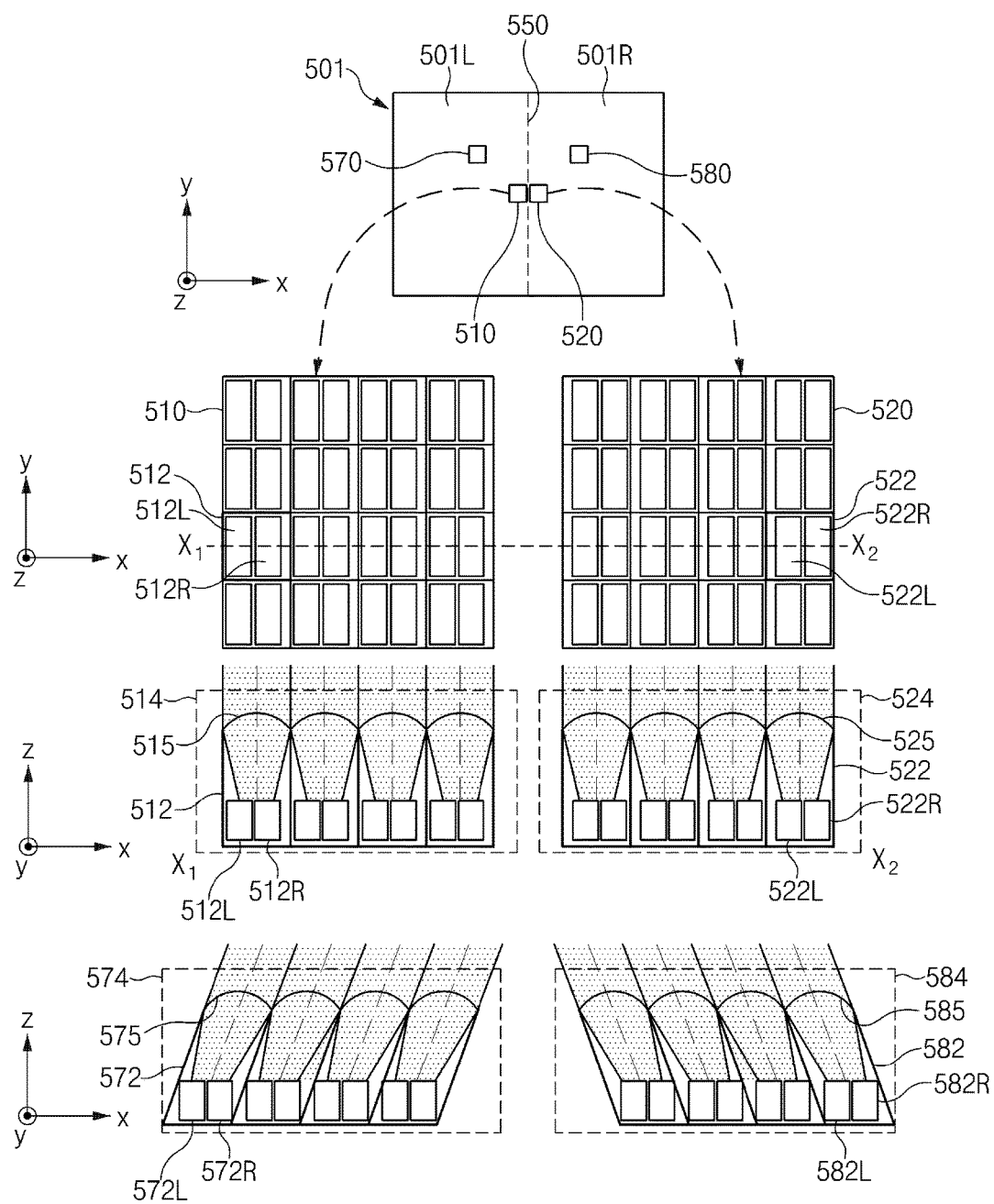
FIG. 5 illustrates an image sensor including two photodetectors in a unit pixel, according to an embodiment of the present disclosure.

FIG. 5 illustrates an image sensor including two photodetectors in a unit pixel, according to an embodiment of the present disclosure.

Referring to FIG. 5, an image sensor 501 includes a plurality of unit pixels. The image sensor 501 may be divided into a left-side area 501L and a right-side area 501R with respect to an auxiliary line 550 bisecting the image sensor 501.

16 unit pixels may be included in a first area 510 of the left-side area 501L. For example, a unit pixel 512 may include two photodetectors 512L and 512R. Likewise, a unit pixel 522 included in a second area 520 of the right-side area 501R may include two photodetectors 522L and 522R. Like pixels of the first area 510, photodetectors of a pixel included in the left-side area 501L may be disposed to be shifted in a −x-axis direction (left-side direction). In contrast, like pixels of the second area 520, photodetectors of a pixel included in the right-side area 501R may be disposed to be shifted in a +x-axis direction (right-side direction).

For example, the first area 510 and the second area 520 are illustrated like sectional views 514 and 524 when the areas 510 and 520 are viewed in a +y-axis direction after cutting the first area 510 and the second area 520 in a −z-axis direction along an auxiliary line X1-X2.

Referring to the sectional view 514, incident light of the −z-axis direction may be focused by passing through a micro lens 515 provided in each pixel. The focused incident light (or beam) may form an optical spot on the photodetectors 512L and 512R of the unit pixel 512. In this case, a physical center point of the unit pixel 512 and a center point of the optical spot may be designed to be spaced apart from each other by a specified distance. That is, the physical center point of the unit pixel 512 and the center point of the optical spot may be finely mismatched. A difference between output values from the photodetectors 512L and 512R may occur due to a gap between the physical center point of the unit pixel 512 and the center point of the optical spot.

Referring to the sectional view 524, as in the sectional view 514, the incident light of the −z-axis direction may be focused by passing through a micro lens 525 provided in each pixel. The focused incident light may form an optical spot on the photodetectors 522L and 522R of the unit pixel 522. A physical center point of the unit pixel 522 and a center point of the optical spot may be designed to be spaced apart from each other by a specified distance.

A sectional view 574 is a sectional view of a third area 570 that is relatively distant from the auxiliary line 550 to a left side (in the −x-axis direction), and a sectional view 584 is a sectional view of a fourth area 580 that is relatively distant from the auxiliary line 550 to a right side (in the +x-axis direction).

Referring to the sectional views 574 and 584, a chief ray angle (CRA) of rays of light incident on a micro lens of a pixel may increase as a location of the pixel becomes distant from the auxiliary line 550, which is a center line of the image sensor 501. Accordingly, an optical spot may be formed to be biased in a peripheral direction of the image sensor 501 with respect to a center point of a micro lens such that a physical center point of a unit pixel and a center point of the optical spot are spaced apart from each other by a specified distance (e.g., a difference between output values of two photodetectors is substantially the same as that of unit pixels illustrated in the sectional view 514 and the sectional view 524). That is, the optical spot may be acentric in relationship with a center point of a micro lens. As such, the center point of the micro lens and a physical center point of a unit pixel may be more and more spaced apart from each other compared with the sectional views 514 and 524.

Referring to the sectional view 574, a spacing distance of the x-axis direction between a physical center point (a center point of a gap between a photodetector 572L and a photodetector 572R) of a pixel 572 and a center point of a micro lens 575 may be greater than a spacing distance of the x-axis direction between a physical center point of the pixel 512 and a center point of the micro lens 515. Accordingly, the physical center point of the pixel 572 and a center point of an optical spot may be spaced apart from each other by a specified distance. Likewise, a spacing distance of the x-axis direction between a physical center point (a center point of a gap between a photodetector 582L and a photodetector 582R) of a pixel 582 and a center point of a micro lens 585 may be greater than a spacing distance of the x-axis direction between a physical center point of the pixel 522 and a center point of the micro lens 525. Accordingly, the physical center point of the pixel 582 and a center point of an optical spot may be spaced apart from each other by a specified distance.

According to the above-described embodiment, it is possible to adjust a center point of an optical spot and a location of a physical center point of a unit pixel in a direction of increasing an output difference between photodetectors for each image height.

In FIG. 5, the image sensor 501 is illustrated as being disposed in a landscape format where a side of the x axis direction is longer and being bisected in the x-axis direction by the auxiliary line 550. However, the image sensor 501 may be disposed in a portrait format where a side of the y-axis direction is longer and may be laterally bisected in the x-axis direction by the auxiliary line 550.

Figure 6A:
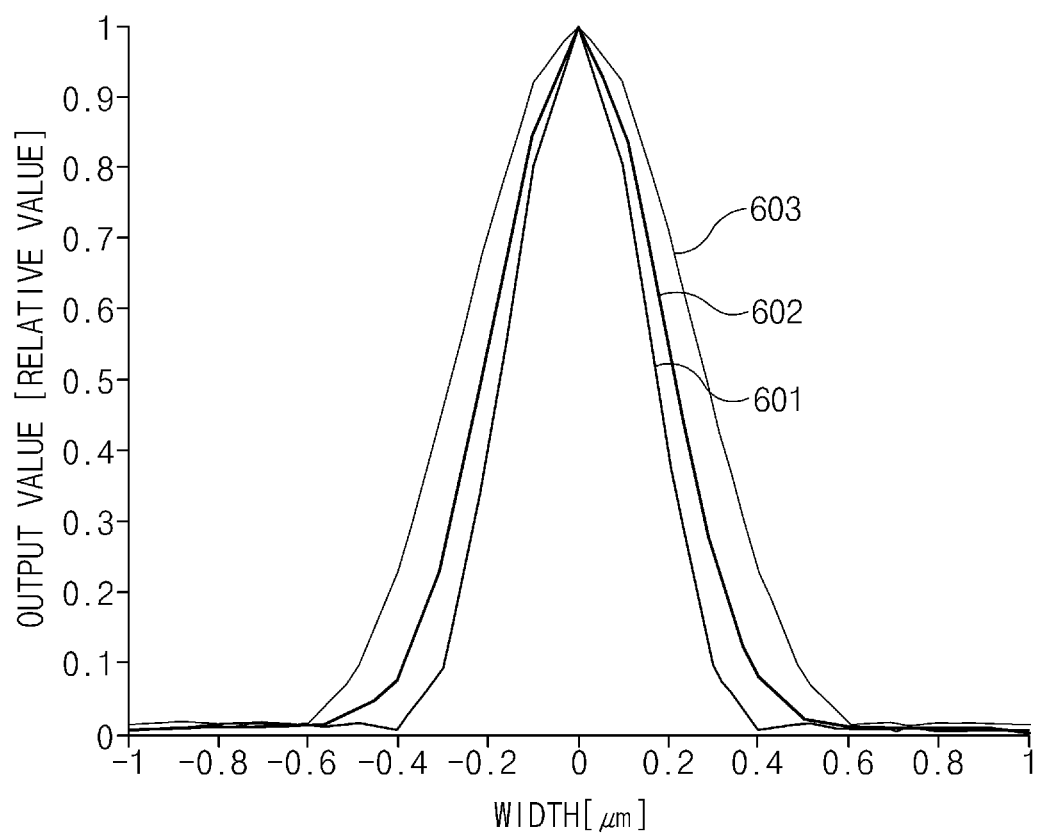
FIGS. 6A and 6B illustrate an optical spot according to an embodiment of the present disclosure.
Figure 6B:
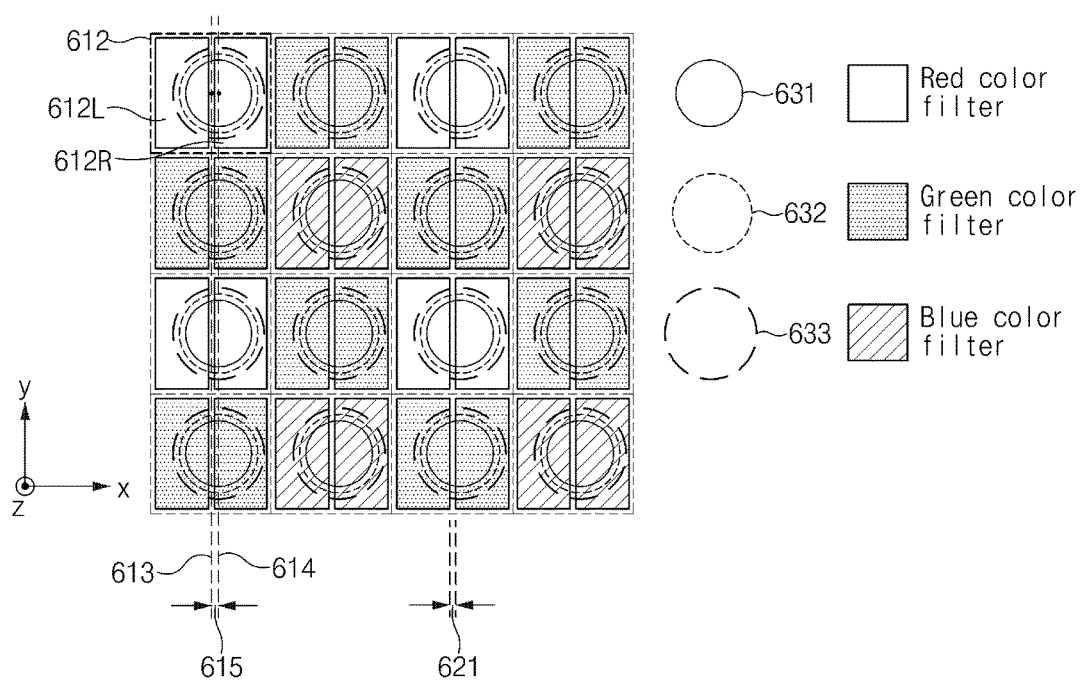

FIGS. 6A and 6B illustrate an optical spot according to an embodiment of the present disclosure.

Referring to FIG. 6A, a width (or diameter) of an optical spot formed on a photodetector(s) is labeled on a horizontal axis, and a value output by the photodetector(s) in response to the optical spot is labeled on a vertical axis. A length (or width) of one side of a unit pixel used in FIG. 6A is about 1.4 μm.

Graph 601 indicates a width of an optical spot that light having a wavelength (e.g., about 405 nm to 475 nm) corresponding to blue forms and an output value. As shown in graph 601, a width of the optical spot that the light having the wavelength corresponding to the blue forms is about 0.8 μm.

Graph 602 indicates a width of an optical spot that light having a wavelength (e.g., about 505 nm to 575 nm) corresponding to green forms and an output value. As shown in graph 602, a width of the optical spot that the light having the wavelength corresponding to the green forms is about 1.0 μm.

Graph 603 indicates a width of an optical spot that light having a wavelength (e.g., about 675 nm to 725 nm) corresponding to red forms and an output value. As shown in graph 603, a width of the optical spot that the light having the wavelength corresponding to the green forms is about 1.2 μm.

As illustrated by graphs 601, 602, and 603, a width of an optical spot increases as a wavelength becomes longer because refraction of a micro lens increases as a wavelength of light becomes shorter.

FIG. 6B illustrates an optical spot formed in each unit pixel of an image sensor according to an embodiment of the present disclosure. Each unit pixel included in the image sensor may include two photodetectors and a color filter of a specified color. For example, a plurality of unit pixels included in the image sensor may include a first group of unit pixels, a second group of unit pixels, and a third group of unit pixels.

Each of the unit pixels in the first group may include a first color filter that passes light having a first wavelength range. For example, the first wavelength range may include a wavelength range corresponding to red (R). That is, the first color filter may be a red color filter. Since each unit pixel in the first group includes a red color filter, an optical spot 631 that a blue light component forms and an optical spot 632 that a green light component forms may be mostly reflected, and an optical spot 633 that a red light component forms may be formed on photodetectors of each unit pixel in the first group.

Each of the unit pixels in the second group may include a second color filter that passes light having a second wavelength range. For example, the second wavelength range may include a wavelength range corresponding to green (G). That is, the second color filter may be a green color filter. Since each unit pixel in the second group includes a green color filter, the optical spot 631 that a blue light component forms and the optical spot 633 that a red light component forms may be mostly reflected, and the optical spot 632 that a green light component forms may be formed on photodetectors of each unit pixel in the second group.

The number of green color filters may be twice the number of red color filters or may be twice the number of green color filters. Accordingly, a ratio of green color filters, red color filters, and green color filters may be 2:1:1.

Each of the unit pixels in the third group may include a third color filter that passes light having a third wavelength range. For example, the third wavelength range may include a wavelength range corresponding to blue (B). That is, the third color filter may be a blue color filter. Since each unit pixel in the third group includes a blue color filter, the optical spot 632 that a green light component forms and the optical spot 633 that a red light component forms may be mostly reflected, and the optical spot 631 that a blue light component forms may be formed on photodetectors of each unit pixel in the third group.

A pixel 612 includes a first photodetector 612L and a second photodetector 612R. A gap 615 between the first photodetector 612L and the second photodetector 612R may be determined according to a design to have a specified length. A physical center point of the pixel 612 located on an auxiliary line 613 is spaced apart from a center point of an optical spot located on an auxiliary line 614 by a specified gap 615. A difference between output values from the photodetectors 612L and 612R may occur due to the specified gap 615.

Figure 7:
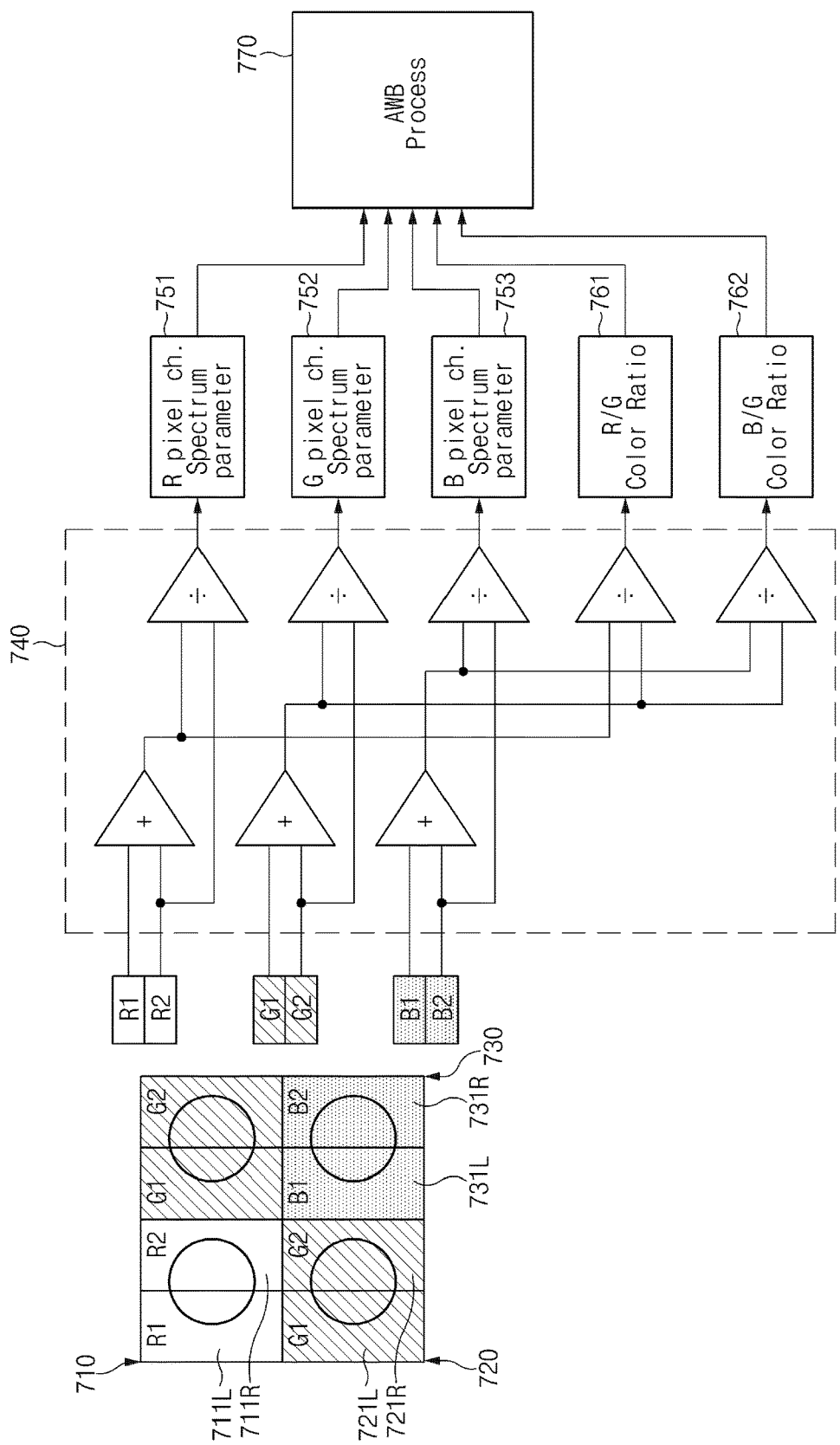
FIG. 7 illustrates a wavelength spectrum of incident light being detected based on output values from two photodetectors, according to an embodiment of the present disclosure.

FIG. 7 illustrates a wavelength spectrum of incident light being detected based on output values from two photodetectors, according to an embodiment of the present disclosure.

Referring to FIG. 7, an electronic device may calculate specific parameters based on output values from two photodetectors included in each unit pixel and may detect a wavelength spectrum of incident light by using the calculated parameters.

An image sensor includes a first unit pixel 710, a second unit pixel 720, and a third unit pixel 730. For example, the first unit pixel 710, the second unit pixel 720, and the third unit pixel 730 may include a red color filter, a green color filter, and a blue color filter. That is, the first unit pixel 710 including the red color filter may belong to a first group of unit pixels, the second unit pixel 720 including the green color filter may belong to a second group of unit pixels, and the third unit pixel 730 including the blue color filter may belong to a third group of unit pixels.

The first unit pixel 710 includes a first photodetector 711L and a second photodetector 711R. The first photodetector 711L and the second photodetector 711R respectively output a first red output value R1 and a second red output value R2 in response to incident light. Likewise, a first photodetector 721L and a second photodetector 721R of the second unit pixel 720 respectively output a first green output value G1 and a second green output value G2 in response to incident light. A first photodetector 731L and a second photodetector 731R of the third unit pixel 730 respectively output a first blue output value B1 and a second blue output value B2 in response to incident light.

A processor of an electronic device may calculate specific parameters based on the output values R1, R2, G1, G2, B1, and B2 from the pixels 710, 720, and 730. For example, the processor may calculate parameters 751, 752, 753, 761, and 762 by performing computation corresponding to a logic circuit 740.

The processor may add the first red output value R1 and the second red output value R2 from the first unit pixel 710 and may divide the addition result (R1+R2) by the second red output value R2. Accordingly, a red channel spectrum parameter 751 may be calculated to be (R1+R2)/R2. Similarly, a green channel spectrum parameter 752 may be calculated to be (G1+G2)/G2, and a blue channel spectrum parameter 753 may be calculated to be (B1+B2)/B2.

The processor may also calculate parameters 761 and 762 indicating ratios of a red output value, a green output value, and a blue output value. As such, it may be possible to estimate a ratio of red, green, and blue included in incident light. The processor may divide a value obtaining by adding the first red output value R1 and the second red output value R2 by a value obtained by adding the first green output value G1 and the second green output value G2. Accordingly, a red/green color ratio 761 may be calculated to be (R1+R2)/(G1+G2). Similarly, a blue/green color ratio 762 may be calculated to be (B1+B2)/(G1+G2).

The processor may detect a wavelength spectrum of incident light by using the calculated parameters 751, 752, 753, 761, and 762 or may determine a type of a light source corresponding to the wavelength spectrum. Afterwards, the processor may apply AWB corresponding to the determined type of the light source to a photographed image (770).

The processor may estimate a rough wavelength spectrum of incident light after seizing a ratio of red, green, and blue by using the red/green color ratio 761 and the blue/green color ratio 762. Thereafter, the processor may verify output asymmetry of photodetectors in each unit pixel from the red channel spectrum parameter 751, the green channel spectrum parameter 752, and the blue color spectrum parameter 753. The processor may detect a wavelength spectrum more accurately in the corresponding color channel by using the output asymmetry.

Although FIG. 7 uses output values obtained from the three pixels 710, 720, and 730, the present disclosure is not be limited thereto. For example, the processor may obtain output values from a first photodetector and a second photodetector included in each pixel of each group R/G/B and may obtain average values R1', G1', and B1' of output values R1, G1, and B1 of the first photodetector and average values R2', G2', and B2' of output values R2, G2, and B2 of the second photodetector for each group. The processor may calculate a parameter by using the average values R1', G1', B R2', G2', and B2' and may detect a wavelength spectrum of incident light by using the calculated parameters.

Figure 8:
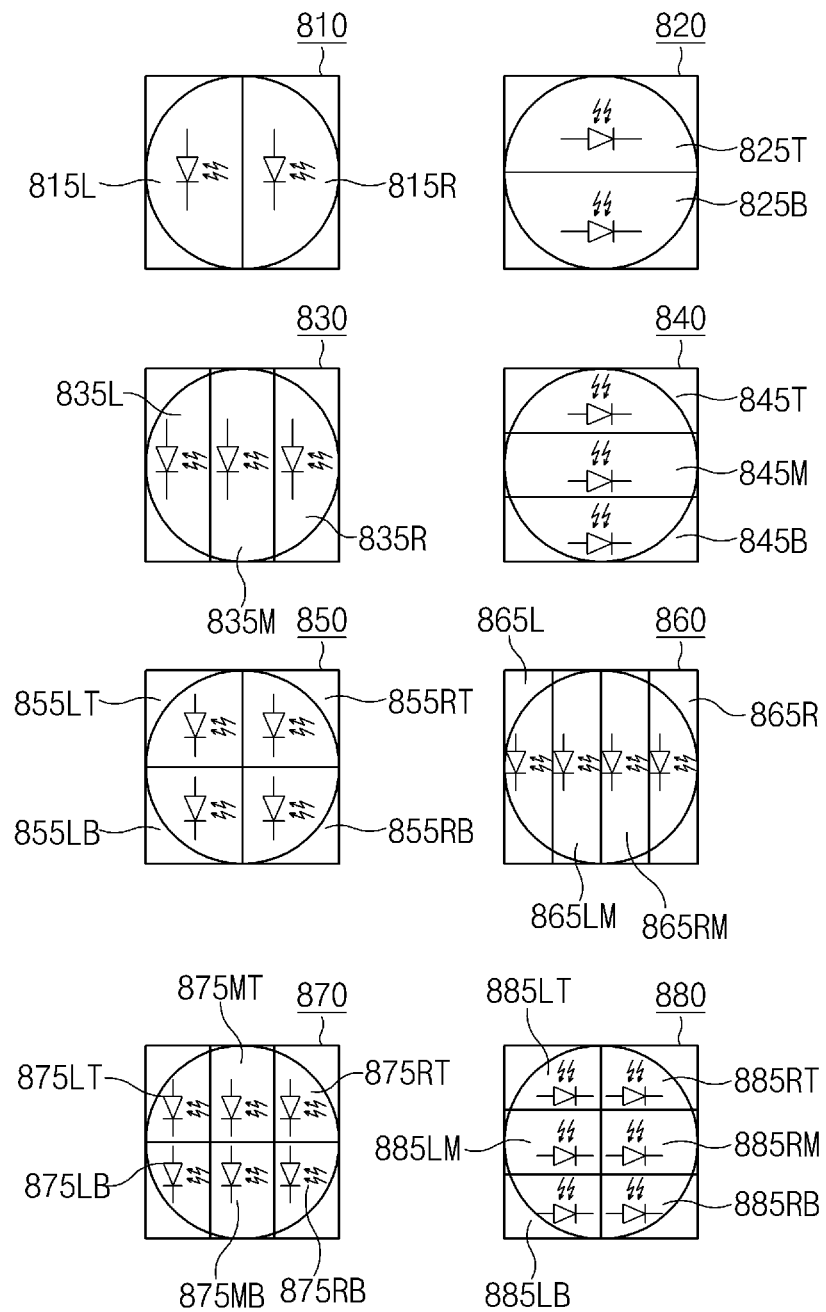
FIG. 8 illustrates a photodetector according to an embodiment of the present disclosure.

FIG. 8 illustrates a photodetector according to an embodiment of the present disclosure.

Referring to FIG. 8, photodetectors are disposed in unit pixels 810 to 860. Various types of unit pixels 810 to 860 illustrated in FIG. 8 may be included in the pixel array of the image sensor 313 of FIG. 3. The arrangement of photodetectors illustrated in FIG. 8 is, but is not limited thereto, an example.

The unit pixel 810 includes a first photodetector 815L and a second photodetector 815R that are horizontally disposed. The unit pixel 810 indicates photodetector arrangement of the unit pixel as described above with reference to FIGS. 4 to 7. Alternatively, the unit pixel 820 may include a first photodetector 825T and a second photodetector 825B that are vertically disposed.

The unit pixel 830 includes a first photodetector 835L disposed on the left, a second photodetector 835M disposed in the middle, and a third photodetector 835R disposed on the right along the horizontal direction. The unit pixel 830 indicates photodetector arrangement of a unit pixel that will be described in more detail with reference to FIGS. 9 and 10. Alternatively, the unit pixel 840 includes a first photodetector 845T disposed on the top, a second photodetector 845M disposed in the middle, and a third photodetector 845B disposed on the bottom along the vertical direction.

The unit pixel 850 includes a first photodetector 855LT disposed at the left top, a second photodetector 855RT disposed at the right top, a third photodetector 855LB disposed at the left bottom, and a fourth photodetector 855RB disposed at the right bottom. Alternatively, the unit pixel 860 includes a first photodetector 865L, a second photodetector 865LM, a third photodetector 865RM, and a fourth photodetector 865R sequentially in a horizontal direction. As another alternative, the four photodetectors 865L, 865LM, 865RM, and 865R may be sequentially disposed in the vertical direction.

The unit pixel 870 includes a first photodetector 875LT, a second photodetector 875MT, and a third photodetector 875RT disposed on the top along the horizontal direction, and includes a fourth photodetector 875LB, a fifth photodetector 875MB, and a sixth photodetector 875RB disposed on the bottom along the horizontal direction. The unit pixel 870 indicates photodetector arrangement of a unit pixel that will be described in more detail below with reference to FIG. 12. Alternatively, the unit pixel 880 includes a first photodetector 885LT, a second photodetector 885LM, and a third photodetector 885LB disposed on the left along the vertical direction, and includes a fourth photodetector 885RT, a fifth photodetector 885RB, and a sixth photodetector 885RB disposed on the right along the vertical direction.

Figure 9:
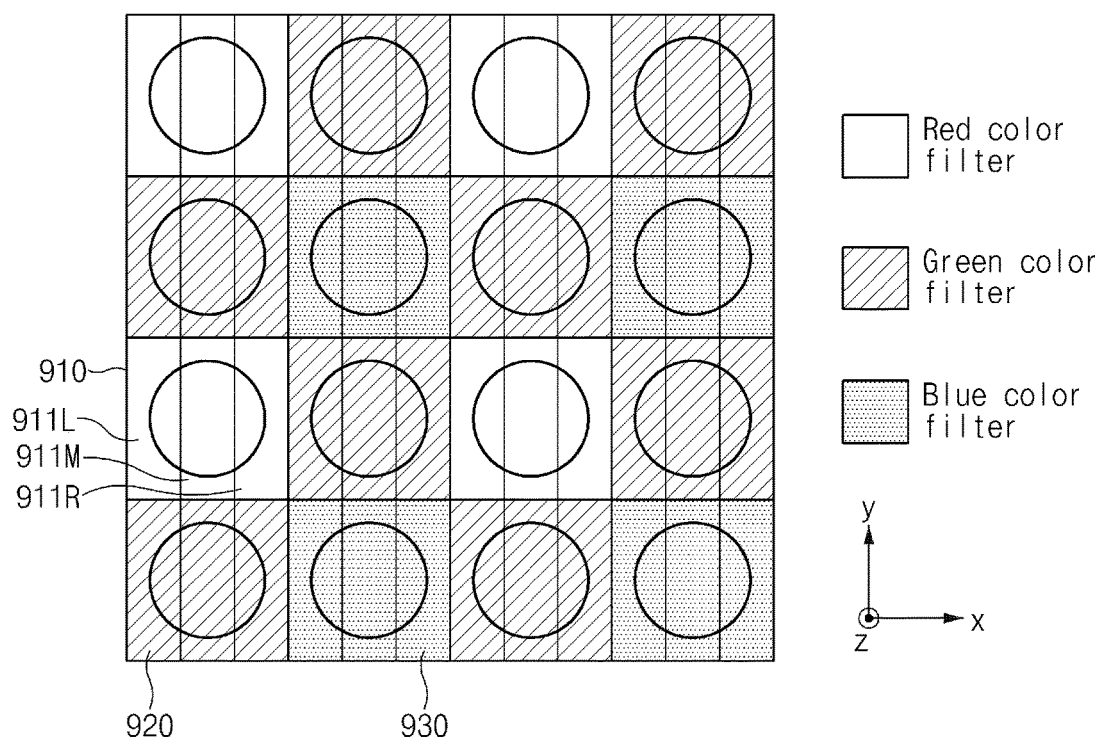
FIG. 9 illustrates a unit pixel including three photodetectors according to an embodiment of the present disclosure.

FIG. 9 illustrates a unit pixel including three photodetectors according to an embodiment of the present disclosure.

Referring to FIG. 9, each unit pixel included in the image sensor includes three photodetectors and a color filter of a specified color. For example, a plurality of unit pixels included in the image sensor may include a first group of unit pixels, a second group of unit pixels, and a third group of unit pixels.

Each of the unit pixels in the first group includes a first color filter that passes light having a wavelength range corresponding to red (R). Each of the unit pixels in the second group includes a second color filter that passes light having a wavelength range corresponding to green (G). Each of the unit pixels in the third group includes a third color filter that passes light having a wavelength range corresponding to blue (B).

A unit pixel 910 includes a first photodetector 911L, a second photodetector 911M, and a third photodetector 911R sequentially in a +x-axis direction. Unlike a unit pixel having two photodetectors, a physical center point of the unit pixel 910 and a center point of an optical spot formed on the three photodetectors 911L, 911M, and 911R by incident light may be set to coincide with each other.

Figure 10:
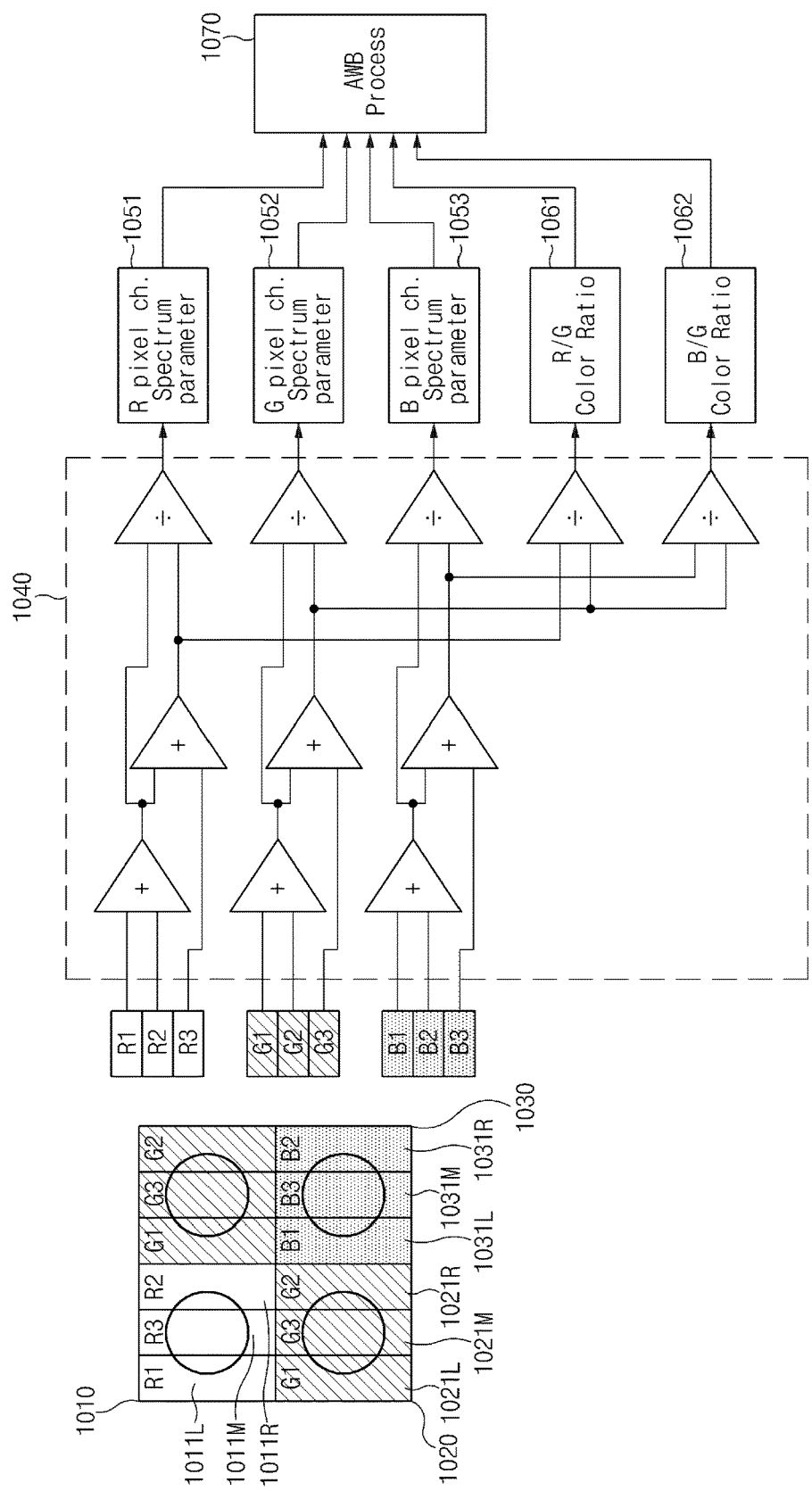
FIG. 10 illustrates a wavelength spectrum of incident light being detected based on output values from three photodetectors, according to an embodiment of the present disclosure.

FIG. 10 illustrates a wavelength spectrum of incident light being detected based on output values from three photodetectors, according to an embodiment of the present disclosure.

Referring to FIG. 10, an electronic device may calculate specific parameters based on output values from three photodetectors included in each unit pixel and may detect a wavelength spectrum of incident light by using the calculated parameters.

An image sensor includes a first unit pixel 1010, a second unit pixel 1020, and a third unit pixel 1030. For example, the first unit pixel 1010, the second unit pixel 1020, and the third unit pixel 1030 include a red color filter, a green color filter, and a blue color filter, respectively. That is, the first unit pixel 1010 including the red color filter may belong to a first group of unit pixels, the second unit pixel 1020 including the green color filter may belong to a second group of unit pixels, and the third unit pixel 1030 including the blue color filter may belong to a third group of unit pixels. In each of the first unit pixel 1010, the second unit pixel 1020, and the third unit pixel 1030, a physical center point of a pixel and a center point of an optical spot may coincide with each other.

The first unit pixel 1010 includes a first photodetector 1011L disposed on the left, a second photodetector 1011R disposed on the right, and a third photodetector 1011M disposed in the middle. The first photodetector 1011L, the second photodetector 1011R, and the third photodetector 1011M respectively output a first red output value R1, a second red output value R2, and a third red output value R3 in response to incident light. Similarly, a first photodetector 1021L, a second photodetector 1021R, and a third photodetector 1021M of the second unit pixel 1020 respectively output a first green output value G1, a second green output value G2, and a third green output value G3 in response to incident light. A first photodetector 1031L, a second photodetector 1031R, and a third photodetector 1031M of the third unit pixel 1030 respectively output a first blue output value B1, a second blue output value B2, and a third blue output value G3 in response to incident light.

A processor of an electronic device may calculate specific parameters based on the output values R1, R2, R3, G1, G2, G3, B1, B2, and B3 from the pixels 1010, 1020, and 1030. For example, the processor may calculate parameters 1051, 1052, 1053, 1061, and 1062 by performing computation corresponding to a logic circuit 1040.

The processor adds the first red output value R1 and the second red output value R2 from the first unit pixel 1010 and adds the third red output value R3 to the addition result (R1+R2). Thereafter, the processor divides the addition result (R1+R2) of the first red output value R1 and the second red output value R2 by an addition result (R1+R2+R3) of the first red output value R1, the second red output value R2, and the third red output value R3. Accordingly, a red channel spectrum parameter 1051 is calculated by (R1+R2)/(R1+R2+R3). Similarly, a green channel spectrum parameter 1052 is calculated by (G1+G2)/(G1+G2+G3), and a blue channel spectrum parameter 1053 is calculated by (B1+B2)/(B1+B2+B3).

The processor may calculate parameters 1061 and 1062 indicating ratios of a red output value, a green output value, and a blue output value. As such, it is possible to estimate a ratio of red, green, and blue included in incident light. For example, the processor divides the addition result (R1+R2+R3) of the first red output value R1, the second red output value R2, and the third red output value R3 by an addition result (G1+G2+G3) of the first green output value G1, the second green output value G2, and the third green output value G3. Accordingly, a red/green color ratio 1061 is calculated by (R1+R2+R3)/(G1+G2+G3). Similarly, a blue/green color ratio 1062 is calculated to be (B1+B2+B3)/(G1+G2+G3).

The processor may detect a wavelength spectrum of incident light by using the calculated parameters 1051, 1052, 1053, 1061, and 1062 or may determine a type of a light source corresponding to the wavelength spectrum. Thereafter, the processor may apply AWB corresponding to the determined type of the light source to a photographed image (1070).

For example, the processor may estimate a rough wavelength spectrum of incident light after seizing a ratio of red, green, and blue by using the red/green color ratio 1061 and the blue/green color ratio 1062. Thereafter, the processor verifies an output distribution of photodetectors in each unit pixel from the red channel spectrum parameter 1051, the green channel spectrum parameter 1052, and the blue color spectrum parameter 1053. The processor may detect a wavelength spectrum more exactly in the corresponding color channel by using the output distribution.

Although FIG. 10 uses output values obtained from the three pixels 1010, 1020, and 1030, the present disclosure is not be limited thereto. For example, the processor may obtain output values from a first photodetector, a second photodetector, and a third photodetector included in each pixel of each group R/G/B and may obtain average values R1', G1', and B1' of output values R1, G1, and B1 of the first photodetector, average values R2', G2', and B2' of output values R2, G2, and B2 of the second photodetector, and average values R3', G3', and B3' of output values R3, G3, and B3 of the third photodetector for each group. The processor may calculate a parameter by using the average values R1', G1', B1', R2', G2', B2', R3', G3', and B3' and may detect a wavelength spectrum of incident light by using the calculated parameters.

Figure 11:
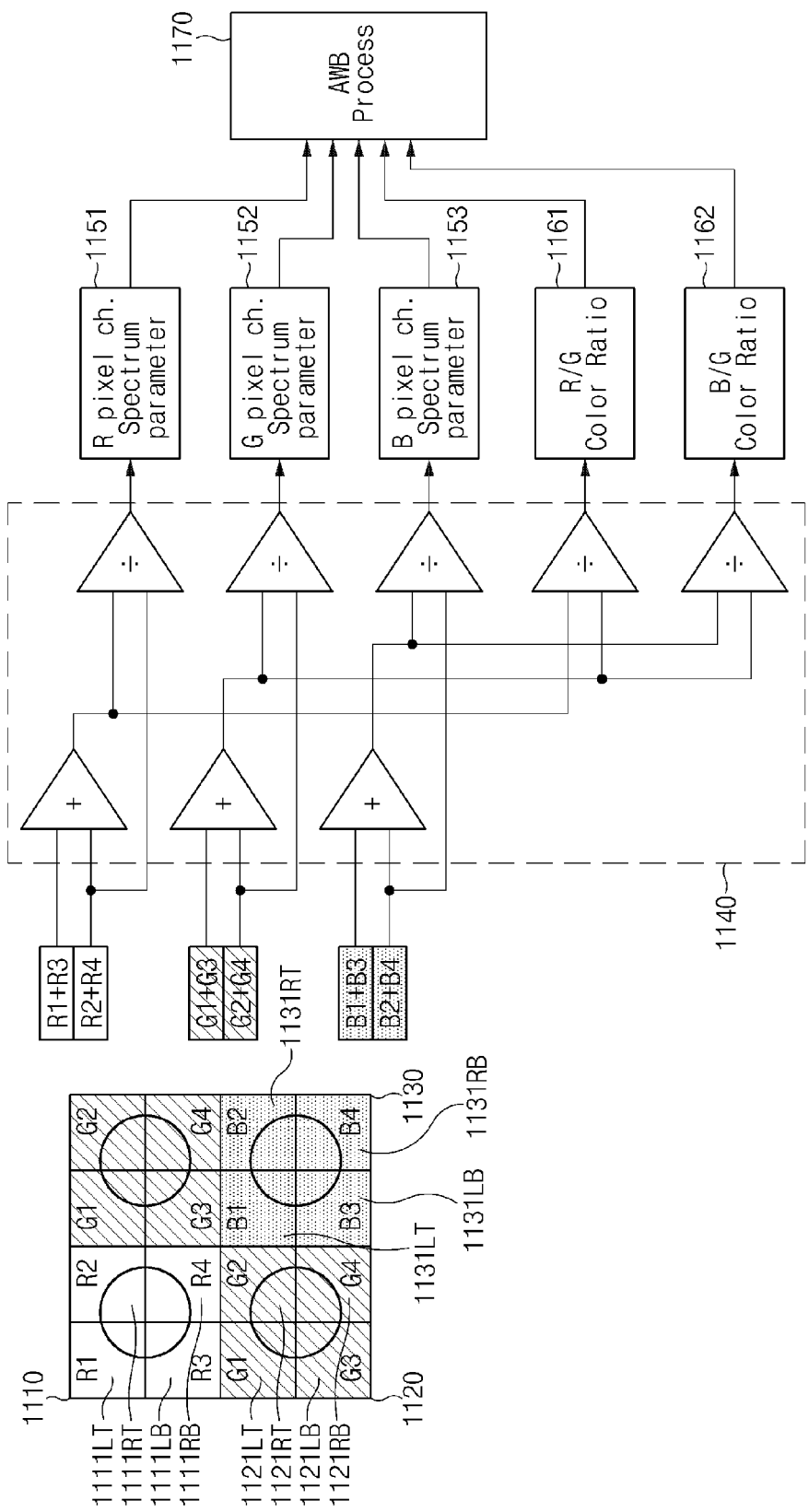
FIG. 11 illustrates a wavelength spectrum of incident light being detected based on output values from four photodetectors, according to an embodiment of the present disclosure.

FIG. 11 illustrates a wavelength spectrum of incident light being detected based on output values from four photodetectors, according to an embodiment of the present disclosure.

Referring to FIG. 11, an electronic device may calculate specific parameters based on output values from four photodetectors included in each unit pixel and may detect a wavelength spectrum of incident light by using the calculated parameters.

An image sensor includes a first unit pixel 1110, a second unit pixel 1120, and a third unit pixel 1130. For example, the first unit pixel 1110, the second unit pixel 1120, and the third unit pixel 1130 include a red color filter, a green color filter, and a blue color filter, respectively. That is, the first unit pixel 1110 including the red color filter may belong to a first group of unit pixels, the second unit pixel 1120 including the green color filter may belong to a second group of unit pixels, and the third unit pixel 1130 including the blue color filter may belong to a third group of unit pixels.

The unit pixel 1110 includes a first photodetector 1111LT disposed at the left top, a second photodetector 1111RT disposed at the right top, a third photodetector 1111LB disposed at the left bottom, and a fourth photodetector 1111RB disposed at the right bottom. The first photodetector 1111LT, the second photodetector 1111RT, the third photodetector 1111LB, and the fourth photodetector 1111RB respectively output a first red output value R1, a second red output value R2, a third red output value R3, and a fourth red output value R4 in response to incident light. Similarly, a first photodetector 1121LT, a second photodetector 1121RT, a third photodetector 1121LB, and a fourth photodetector 1121RB of the second unit pixel 1120 respectively output a first green output value G1, a second green output value G2, a third green output value G3, and a fourth green output value G4 in response to incident light. A first photodetector 1131LT, a second photodetector 1131RT, a third photodetector 1131LB, and a fourth photodetector 1131RB of the third unit pixel 1130 respectively output a first blue output value B1, a second blue output value B2, a third blue output value B3, and a fourth blue output value B4 in response to incident light. In the first unit pixel 1110, a physical center point of a pixel and a center point of an optical spot may be spaced apart from each other by a specified gap. Accordingly, in the first unit pixel 1110, an output value (R1+R3) and an output value (R2+R4) may have an asymmetrical value (i.e., a difference may occur in an output value).

A processor of an electronic device may calculate specific parameters based on the output values R1, R2, R3, R4, G1, G2, G3, G4, B1, B2, B3, and B4 from the pixels 1110, 1120, and 1130. For example, the processor may calculate parameters 1151, 1152, 1153, 1161, and 1162 by performing computation corresponding to a logic circuit 1140.

The processor adds a sum (R1+R3) of the first red output value R1 and the third red output value R3 and a sum (R2+R4) of a second red output value R2 and a fourth red output value R4, and divides the addition result (R1+R2+R3+R4) by an addition result (R2+R4) of the second red output value R2 and the fourth red output value R4. Accordingly, a red channel spectrum parameter 1151 may be calculated by (R1+R2+R3+R4)/(R2+R4). Similarly, a green channel spectrum parameter 1052 may be calculated by (G1+G2+G3+G4)/(G2+G4), and a blue channel spectrum parameter 1053 may be calculated by (B1+B2+B3+B4)/(B2+B4). Computation of the logic circuit 1140 may correspond to computation of the logical circuit 740 illustrated in FIG. 7.

The processor calculates parameters 1161 and 1162 indicating ratios of a red output value, a green output value, and a blue output value. As such, it may be possible to estimate a ratio of red, green, and blue included in incident light. For example, the processor divides the addition result (R1+R2+R3+R4) of the first red output value R1 to the fourth red output value R4 by an addition result (G1+G2+G3+G4) of the first green output value G1 to the fourth green output value G4. Accordingly, a red/green color ratio 1161 is calculated by (R1+R2+R3+R4)/(G1+G2+G3+G4). Similarly, a blue/green color ratio 1162 may be calculated by (B1+B2+B3+B4)/(G1+G2+G3+G4).

The processor may detect a wavelength spectrum of incident light by using the calculated parameters 1151, 1152, 1153, 1161, and 1162 or may determine a type of a light source corresponding to the wavelength spectrum. Thereafter, the processor applies AWB corresponding to the determined type of the light source to a photographed image (1170).

For example, the processor may estimate a rough wavelength spectrum of incident light after seizing a ratio of red, green, and blue by using the red/green color ratio 1161 and the blue/green color ratio 1162. Thereafter, the processor may verify output asymmetry of photodetectors in each unit pixel from the red channel spectrum parameter 1151, the green channel spectrum parameter 1152, and the blue color spectrum parameter 1153. The processor may detect a wavelength spectrum more accurately in the corresponding color channel by using the output asymmetry.

Figure 12:
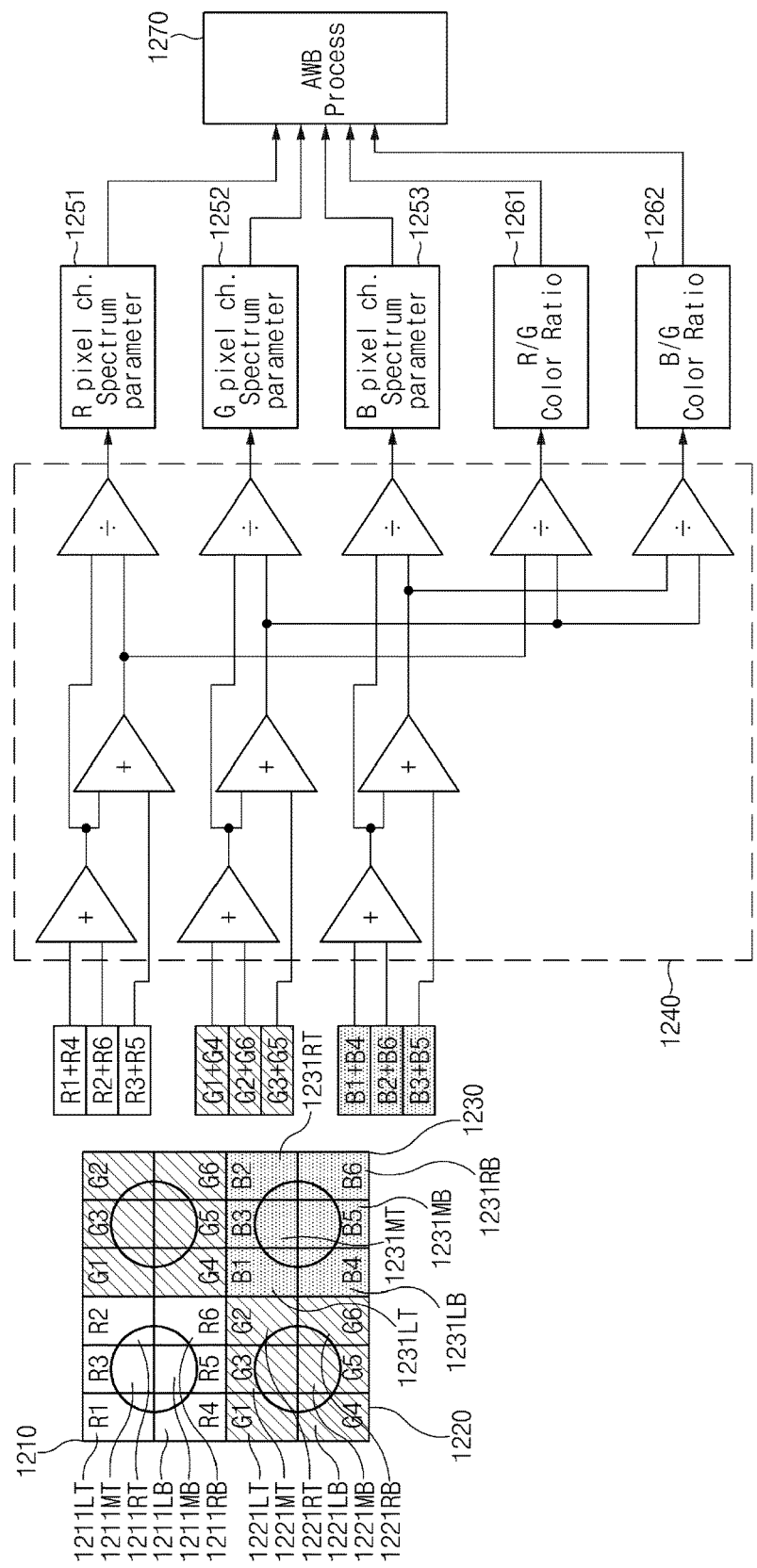
FIG. 12 illustrates a wavelength spectrum of incident light being detected based on output values from six photodetectors, according to an embodiment of the present disclosure.

FIG. 12 illustrates a wavelength spectrum of incident light being detected based on output values from six photodetectors, according to an embodiment of the present disclosure.

Referring to FIG. 12, an electronic device may calculate specific parameters based on output values from six photodetectors included in each unit pixel and may detect a wavelength spectrum of incident light by using the calculated parameters.

An image sensor includes a first unit pixel 1210, a second unit pixel 1220, and a third unit pixel 1230. For example, the first unit pixel 1210, the second unit pixel 1220, and the third unit pixel 1230 include a red color filter, a green color filter, and a blue color filter, respectively. That is, the first unit pixel 1210 including the red color filter may belong to a first group of unit pixels, the second unit pixel 1220 including the green color filter may belong to a second group of unit pixels, and the third unit pixel 1230 including the blue color filter may belong to a third group of unit pixels. In each of the first unit pixel 1210, the second unit pixel 1220, and the third unit pixel 1230, a physical center point of a pixel and a center point of an optical spot may coincide with each other.

The unit pixel 1210 includes a first photodetector 1211LT, a second photodetector 1211RT, and a third photodetector 1211MT disposed on the top and a fourth photodetector 1211LB, a fifth photodetector 1211RB, and a sixth photodetector 1211MB disposed on the bottom. The first photodetector 1211LT, the second photodetector 1211RT, the third photodetector 1211MT, the fourth photodetector 1111LB, the fifth photodetector 1211RB, and the sixth photodetector 1211MB respectively output a first red output value R1, a second red output value R2, a third red output value R3, a fourth red output value R4, a fifth red output value R5, and a sixth red output value R6 in response to incident light. Similarly, 6 photodetectors 1221LT, 1221RT, 1221MT, 1221LB, 1221RB, and 1221MB of the second unit pixel 1220 respectively output a first green output value G1, a second green output value G2, a third green output value G3, a fourth green output value G4, a fifth green output value G5, and a sixth green output value G6 in response to incident light, and 6 photodetectors 1231LT, 1231RT, 1231MT, 1231LB, 1231RB, and 1231MB of the third unit pixel 1230 respectively output a first blue output value B1, a second blue output value B2, a third blue output value B3, a fourth blue output value B4, a fifth blue output value B5, and a sixth blue output value G6 in response to incident light.

A processor of an electronic device may calculate specific parameters based on the output values R1, R2, R3, R4, R5, R6, G1, G2, G3, G4, G5, G6, B1, B2, B3, B4, B5, and B6 from the pixels 1210, 1220, and 1230. For example, the processor may calculate parameters 1251, 1252, 1253, 1261, and 1262 by performing computation corresponding to a logic circuit 1240.

The processor may input a value (R1+R4) obtained by adding the first red output value R1 and the fourth red output value R4 from the first unit pixel 1210, a value (R2+R6) obtained by adding the second red output value R2 and the sixth red output value R6 from the first unit pixel 1210, and a value (R3+R5) obtained by adding the third red output value R3 and the fifth red output value R5 from the third first unit pixel 1210 to a logic circuit 1240. According to computation of the logic circuit 1240, the red channel spectrum parameter 1251 may be calculated by (R1+R2+R4+R6)/(R1+R2+R3+R4+R5+R6). Similarly, a green channel spectrum parameter 1252 may be calculated by (G1+G2+G4+G6)/(G1+G2+G3+G4+G5+G6), and a blue channel spectrum parameter 1253 may be calculated by (B1+B2+B4+B6)/(B1+B2+B3+B4+B5+B6). Computation of the logic circuit 1240 may correspond to computation of the logical circuit 1040 illustrated in FIG. 10.

For example, the processor may calculate parameters 1261 and 1262 indicating ratios of a red output value, a green output value, and a blue output value. As such, it is possible to estimate a ratio of red, green, and blue included in incident light. For example, the processor may divide the addition result (R1+R2+R3+R4+R5+R6) of the first red output value R1 to the sixth red output value R6 by an addition result (G1+G2+G3+G4+G5+G6) of the first green output value G1 to the sixth green output value G6. Accordingly, the red/green color ratio 1261 may be calculated by (R1+R2+R3+R4+R5+R6)/(G1+G2+G3+G4+G5+G6). Similarly, a blue/green color ratio 1262 may be calculated by (B1+B2+B3+B4+B5+B6)/(G1+G2+G3+G4+G5+G6).

The processor may detect a wavelength spectrum of incident light by using the calculated parameters 1251, 1252, 1253, 1261, and 1262 or may determine a type of a light source corresponding to the wavelength spectrum. Thereafter, the processor may apply AWB corresponding to the determined type of the light source to a photographed image (1270).

For example, the processor may estimate a rough wavelength spectrum of incident light after seizing a ratio of red, green, and blue by using the red/green color ratio 1261 and the blue/green color ratio 1262. Thereafter, the processor may verify an output distribution of photodetectors in each unit pixel from the red channel spectrum parameter 1251, the green channel spectrum parameter 1252, and the blue color spectrum parameter 1253. The processor may detect a wavelength spectrum more accurately in the corresponding color channel by using the output distribution.

Figure 13:
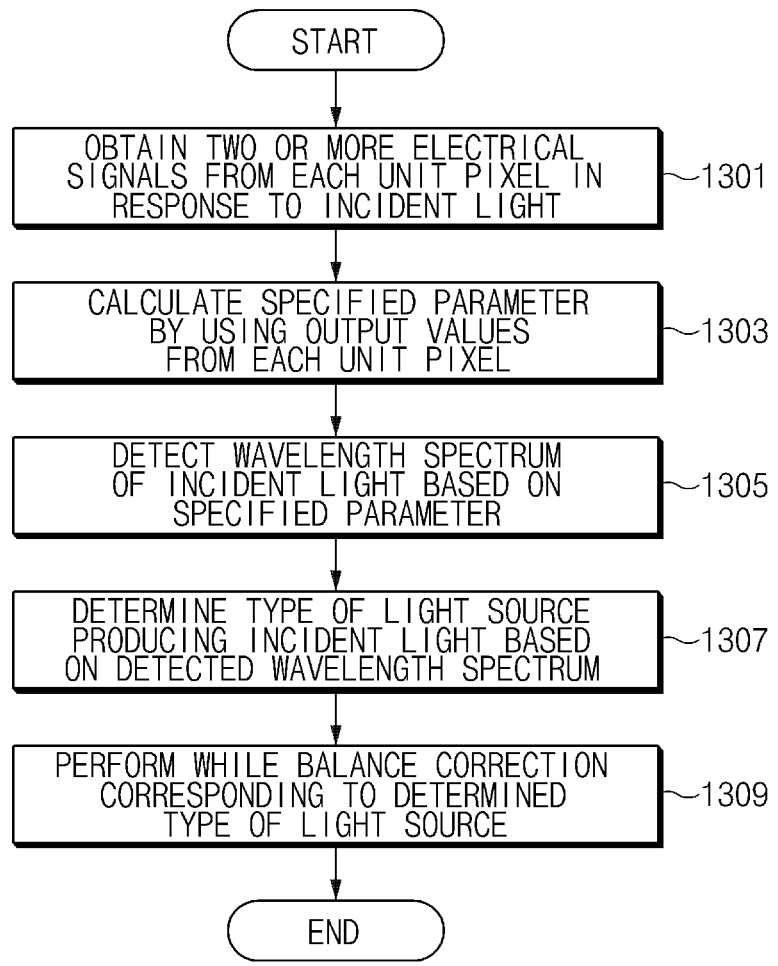
FIG. 13 is a flowchart illustrating a wavelength detecting method according to an embodiment of the present disclosure.

FIG. 13 is a flowchart illustrating a wavelength detecting method according to an embodiment of the present disclosure. For example, the method illustrated in FIG. 13 may be performed by the electronic device 301 illustrated in FIG. 3.

Operations 1301 to 1309 may be respectively implemented with instructions that are capable of being performed (or executed) by the image signal processor 330 or the processor 360 of the electronic device 301. The instructions may be stored in, for example, a computer-readable recording medium or the memory 350 of the electronic device 301 illustrated in FIG. 3.

Referring to FIG. 13, in operation 1301, the processor 360 of the electronic device 301 obtains two or more electrical signals from each unit pixel included in the image sensor 313 in response to the incident light. For example, the unit pixel may include two or more photodetectors. The photoelectric effect may occur by the incident light in the two or more photodetectors, and thus, the electrical signal may be generated.

In operation 1303, the processor 360 calculates a specified parameter by using the output values of the two or more electrical signals obtained in operation 1301. For example, the specified parameter may include the parameters 751, 752, 753, 761, and 762 derived through computation of the logic circuit 740, as illustrated in FIG. 7.

In operation 1305, the processor 360 may detect a wavelength spectrum of the incident light based on the specified parameter. For example, the processor 360 may detect the wavelength spectrum of the incident light with reference to data associated with a correlation between the specified parameter and the wavelength spectrum, stored in the memory 350.

In operation 1307, the processor 360 determines a type of a light source (e.g., daylight, incandescent, a fluorescent lamp, LED yellow, LED white, etc.) that produces the incident light, based on the wavelength spectrum detected in operation 1305. For example, the processor 360 may determine a type of a light source producing the incident light by comparing the detected wavelength spectrum with a pattern in advance stored in the memory 350.

In operation 1309, the processor 306 applies white balance correction corresponding to the type of the light source determined in operation 1307 to at least part of an image.

According to the above described embodiments of the present disclosure, it is possible to detect a wavelength spectrum of incident light more accurately. Further, the accurately detected wavelength spectrum may be utilized to adjust (AWB) more accurately.

As described above, an electronic device may include an image sensor that includes a pixel array, and a processor that is electrically connected with the image sensor. A unit pixel included in the pixel array may include a micro lens that focuses incident light, and two or more photodetectors that output an electrical signal in response to the incident light. The processor may detect a wavelength spectrum of the incident light based on output values from the two or more photodetectors.

The processor may compute at least one parameter by using the output values from the two or more photodetectors and may detect the wavelength spectrum of the incident light based on the at least one parameter.

The electronic device may include a memory that stores data associated with a correlation between the at least one parameter and the wavelength spectrum. The processor may detect the wavelength spectrum of the incident light based on the data associated with the correlation.

The processor may determine a type of a light source producing the incident light by using the detected wavelength spectrum.

The processor may apply white balance correction corresponding to the determined type of the light source to at least part of an image.

Each of the unit pixels may include a color filter disposed below the micro lens to pass a specified wavelength range.

The unit pixel may include two photodetectors. A physical central point of the unit pixel and a central point of an optical spot formed on the two photodetectors by the incident light passing through the micro lens may be spaced apart from each other by a specified distance.

An output difference between output values from the two photodetectors may occur by a gap between the physical center point and the central point of the optical spot.

In each of at least some unit pixels of the pixel array, the optical spot formed on the two photodetectors by the incident light through the micro lens may be biased toward the outside of the image sensor with respect to a center point of the micro lens.

The pixel array may include a first group of unit pixels, a second group of unit pixels, and a third group of unit pixels. Each of the unit pixels in the first group may include a first photodetector, a second photodetector, and a first color filter passing light having a first wavelength range. Each of the unit pixels in the second group may include a first photodetector, a second photodetector, and a second color filter passing light having a second wavelength range. Each of the unit pixels in the third group may include a first photodetector, a second photodetector, and a third color filter passing light having a third wavelength range. The processor may detect the wavelength spectrum of the incident light by using a value that is obtained by dividing a sum of a first output value from the first photodetector and a second output value from the second photodetector by the second output value, for each unit pixel of each group.

The processor may detect the wavelength spectrum of the incident light by further using a ratio of sums of output values in the first group of unit pixels, the second group of unit pixels, and the third group of unit pixels.

The first wavelength range, the second wavelength range, and the third wavelength range may include a wavelength range corresponding to red, a wavelength range corresponding to green, and a wavelength range corresponding to blue, respectively.

The unit pixel includes three or more photodetectors. A physical center point of the unit pixel and a center point of an optical spot formed on the three or more photodetectors by the incident light may be set to coincide with each other.

Each of the two or more photodetectors includes a photo diode.

A wavelength detecting method of an electronic device which includes a plurality of unit pixels may include obtaining two or more electrical signals from a unit pixel in response to incident light, and detecting a wavelength spectrum of the incident light based on output values of the two or more electrical signals.

The method may further include calculating a specified parameter by using the output values of the two or more electrical signals. The wavelength spectrum of the incident light may be detected based on the specified parameter.

The method may further include determining a type of a light source producing the incident light based on the detected wavelength spectrum.

The method may further include applying white balance correction corresponding to the determined type of the light source to at least part of an image.

The plurality of unit pixels may include a first group of unit pixels, a second group of unit pixels, and a third group of unit pixels. Each of the unit pixels in the first group may include a first photodetector, a second photodetector, and a first color filter passing light having a first wavelength range. Each of the unit pixels in the second group may include a first photodetector, a second photodetector, and a second color filter passing light having a second wavelength range. Each of the unit pixels in the third group may include a first photodetector, a second photodetector, and a third color filter passing light having a third wavelength range. The calculating of the specified parameter may include dividing a sum of a first output value from the first photodetector and a second output value from the second photodetector by the second output value, for each unit pixel of each group.

The calculating of the specified parameter may further include obtaining a ratio of sums of output values in the first group of unit pixels, the second group of unit pixels, and the third group of unit pixels.

Herein, the term "module" may represent a unit including one or more combinations of hardware, software and firmware. The term "module" may be interchangeably used with the terms "unit", "logic", "logical block", "component" and "circuit". A "module" may be a minimum unit of an integrated component or may be a part thereof. A "module" may be a minimum unit for performing one or more functions or a part thereof. A "module" may be implemented mechanically or electronically. For example, a "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be implemented by instructions stored in computer-readable storage media in the form of a program module. The instruction, when executed by a processor (e.g., the processor 120), may cause the one or more processors to perform a function corresponding to the instruction. The computer-readable storage media may be the memory 130.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). A program instruction may include a mechanical code such as things generated by a compiler and also a high-level language code executable on a computer using an interpreter. The above-described hardware unit may be configured to operate via one or more software modules for performing an operation according to various embodiments, and vice versa.

A module or a program module according to various embodiments may include at least one of the above elements, or a part of the above elements may be omitted, or additional other elements may be further included. Operations performed by a module, a program module, or other elements according to various embodiments may be executed sequentially, in parallel, repeatedly, or in a heuristic method. In addition, some operations may be executed in different sequences or may be omitted. Alternatively, other operations may be added.

While the present disclosure has been shown and described with reference to certain embodiments thereof, it will be understood by those skilled in the art that various changes in form and details may be made therein without departing from the spirit and scope of the present disclosure as defined by the appended claims and their equivalents.

What is claimed is:

1. An electronic device, comprising:
an image sensor including a pixel array, wherein the pixel array includes a unit pixel including:
a micro lens configured to focus incident light, and
two or more photodetectors configured to output an electrical signal in response to the incident light; and
a processor configured to detect a wavelength spectrum of the incident light based on output values from the two or more photodetectors,
wherein when the unit pixel includes two photodetectors, a physical central point of the unit pixel and a central point of an optical spot formed on the two photodetectors by the incident light passing through the micro lens are spaced apart from each other by a specified distance.

2. The electronic device of claim 1, wherein the processor is further configured to:
compute at least one parameter by using the output values from the two or more photodetectors, and
detect the wavelength spectrum of the incident light based on the at least one parameter.

3. The electronic device of claim 2, further comprising a memory configured to store data associated with a correlation between the at least one parameter and the wavelength spectrum,
wherein the processor is further configured to detect the wavelength spectrum of the incident light based on the data associated with the correlation.

4. The electronic device of claim 1, wherein the processor is further configured to determine a type of a light source producing the incident light by using the detected wavelength spectrum.

5. The electronic device of claim 4, wherein the processor is further configured to apply white balance correction corresponding to the determined type of the light source to at least part of an image.

6. The electronic device of claim 1, wherein the unit pixel further includes a color filter disposed below the micro lens to pass a specified wavelength range.

7. The electronic device of claim 1, wherein an output difference between the output values from the two photodetectors occurs by a gap between the physical center point and the central point of the optical spot.

8. The electronic device of claim 1, wherein the optical spot formed on the two photodetectors by the incident light through the micro lens is biased toward an outside of the image sensor with respect to a center point of the micro lens.

9. The electronic device of claim 1, wherein the pixel array includes a first group of unit pixels, a second group of unit pixels, and a third group of unit pixels,
wherein each of the unit pixels in the first group includes a first photodetector, a second photodetector, and a first color filter passing light having a first wavelength range,
wherein each of the unit pixels in the second group includes a first photodetector, a second photodetector, and a second color filter passing light having a second wavelength range,
wherein each of the unit pixels in the third group includes a first photodetector, a second photodetector, and a third color filter passing light having a third wavelength range, and
wherein the processor is further configured to detect the wavelength spectrum of the incident light by using a value that is obtained by dividing a sum of a first output value from the first photodetector and a second output value from the second photodetector by the second output value, for each unit pixel of each group.

10. The electronic device of claim 9, wherein the processor is further configured to detect the wavelength spectrum of the incident light by further using a ratio of sums of output values in the first group of unit pixels, the second group of unit pixels, and the third group of unit pixels.

11. The electronic device of claim 9, wherein the first wavelength range, the second wavelength range, and the third wavelength range include a wavelength range corresponding to red, a wavelength range corresponding to green, and a wavelength range corresponding to blue, respectively.

12. The electronic device of claim 1, wherein the unit pixel includes three or more photodetectors, and
wherein a physical center point of the unit pixel and a center point of an optical spot formed on the three or more photodetectors by the incident light are set to coincide with each other.

13. The electronic device of claim 1, wherein each of the two or more photodetectors includes a photo diode.

14. A wavelength detecting method of an electronic device including a plurality of unit pixels, the method comprising:
obtaining two or more electrical signals from a unit pixel in response to incident light; and
detecting a wavelength spectrum of the incident light based on output values of the two or more electrical signals,
wherein when the unit pixel includes two photodetectors, a physical central point of the unit pixel and a central point of an optical spot formed on the two photodetectors by the incident light passing through a micro lens are spaced apart from each other by a specified distance.

15. The method of claim 14, further comprising calculating a specified parameter by using the output values of the two or more electrical signals,
wherein the wavelength spectrum of the incident light is detected based on the specified parameter.

16. The method of claim 14, further comprising determining a type of a light source producing the incident light based on the detected wavelength spectrum.

17. The method of claim 16, further comprising applying white balance correction corresponding to the determined type of the light source to at least part of an image.

18. The method of claim 15, wherein the plurality of unit pixels include a first group of unit pixels, a second group of unit pixels, and a third group of unit pixels,
wherein each of the unit pixels in the first group includes a first photodetector, a second photodetector, and a first color filter passing light having a first wavelength range, wherein each of the unit pixels in the second group includes a first photodetector, a second photodetector, and a second color filter passing light having a second wavelength range, wherein each of the unit pixels in the third group includes a first photodetector, a second photodetector, and a third color filter passing light having a third wavelength range, and wherein the calculating of the specified parameter comprises dividing a sum of a first output value from the first photodetector and a second output value from the second photodetector by the second output value, for each unit pixel of each group.

19. The method of claim 18, wherein calculating the specified parameter further comprises obtaining a ratio of sums of output values in the first group of unit pixels, the second group of unit pixels, and the third group of unit pixels.

* * * * *